(12) United States Patent
Kuramata et al.

(10) Patent No.: US 6,606,335 B1
(45) Date of Patent: Aug. 12, 2003

(54) SEMICONDUCTOR LASER, SEMICONDUCTOR DEVICE, AND THEIR MANUFACTURE METHODS

(75) Inventors: Akito Kuramata, Kawasaki (JP); Kazuhiko Horino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/743,636

(22) PCT Filed: Jul. 14, 1999

(86) PCT No.: PCT/JP99/03788

§ 371 (c)(1),
(2), (4) Date: Jan. 12, 2001

(87) PCT Pub. No.: WO00/04615

PCT Pub. Date: Jan. 27, 2000

(30) Foreign Application Priority Data

Jul. 14, 1998  (JP) .......................................... 10-198512
Dec. 15, 1998  (JP) .......................................... 10-355683

(51) Int. Cl.⁷ .................................................. H01S 5/00
(52) U.S. Cl. ..................................................... 372/45
(58) Field of Search ........................ 372/43–50; 257/77

(56) References Cited

U.S. PATENT DOCUMENTS

| | | | |
|---|---|---|---|
| 5,787,104 A | 7/1998 | Kamiyama ................... | 372/43 |
| 6,201,262 B1 * | 3/2001 | Edmond et al. .............. | 257/77 |

FOREIGN PATENT DOCUMENTS

| | | |
|---|---|---|
| DE | 197 15 572 A 1 | 4/1997 |
| EP | 0 852 416 A1 | 7/1998 |
| JP | 08-255932 | 1/1996 |
| JP | 10-321911 | 4/1998 |
| JP | 11-163402 | 6/1999 |
| WO | WO97/11518 | 3/1997 |

OTHER PUBLICATIONS

Sasaoka et al, "Epitaxial Lateral Overgrowth of GaN by Hydride Vapor Phase Epitaxy . . . " Journal of the Japanese Association for Crystal Growth, vol. 25, No. 2 (1998) pp. 21–27 (no month).

Zheleva et al, "Pendeo–Epitaxy: A New Approach for Lateral Growth of Gallium Nitride Films" Journal of Electronic Materials, vol. 28, No. 4, Apr. 1999 pp. L5–L8.

Yawaguchi et al "Selective Area Growth (SAG) and Epitaxial Lateral Overgrowth (ELO) of wurtzite GaN on (III) Si Substrate by Metalorganic Vapor Phase Epitaxy" Compound Semiconductors, 1998, Institute Physics Conference Series No. 162 pp. 687–692 (Oct. 1998).

International Preliminary Examination Report.
International Search Report.

* cited by examiner

*Primary Examiner*—Quyen Leung
(74) *Attorney, Agent, or Firm*—Armstrong, Westerman & Hattori, LLP

(57) ABSTRACT

A substrate is made of SiC. A plurality of $Al_xGa_{1-x}N$ patterns ($0 \leq x \leq 1$) is formed on a surface of the substrate and dispersively distributed in an in-plane of the substrate. An $Al_yGa_{1-y}N$ buffer layer ($0 \leq y \leq 1$) covers the surface of the substrate and the $Al_xGa_{1-x}N$ patterns. A laser structure is formed on the $Al_yGa_{1-y}N$ buffer layer. Since the AlGaN buffer layer is grown by using the AlGaN patterns as seed crystals, a dislocation density of a predetermined region in the AlGaN buffer layer can be lowered. The characteristics of a laser structure can be improved by forming the laser structure above the region having a low dislocation density. Since the AlGaN pattern has electric conductivity, the device resistance can be suppressed from being increased.

14 Claims, 18 Drawing Sheets

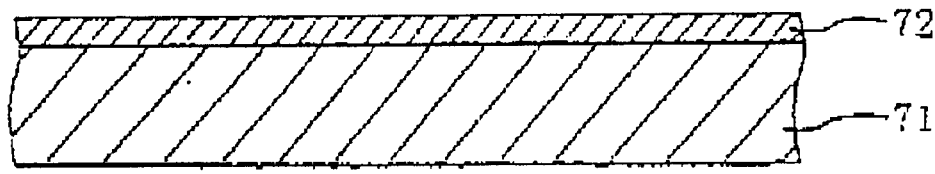
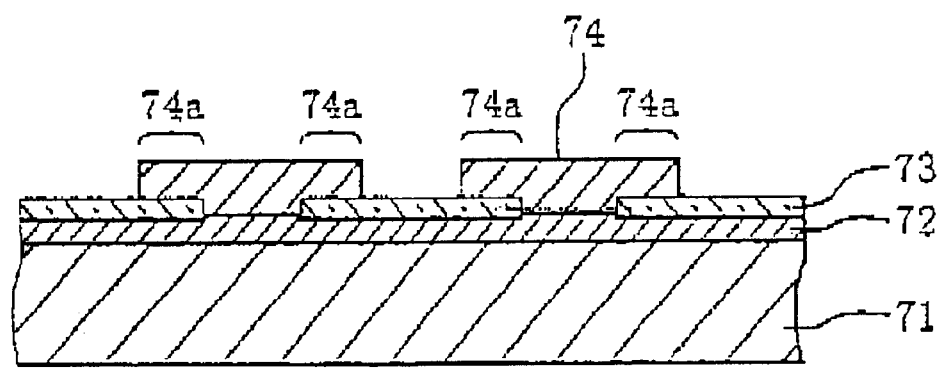
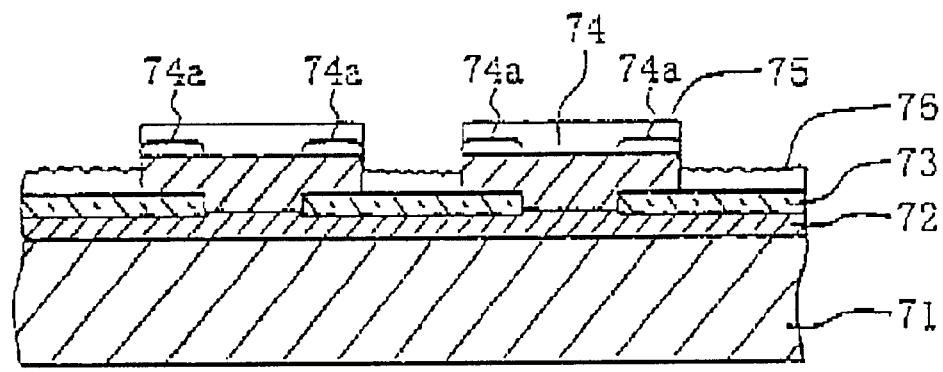

SEMICONDUCTOR LASER, SEMICONDUCTOR DEVICE, AND THEIR MANUFACTURE METHODS

FIELD OF THE INVENTION

The present invention relates to a semiconductor laser, a semiconductor device and their manufacture methods, and more particularly to a semiconductor laser and a semiconductor device having a semiconductor region of a low dislocation density, and to their manufacture methods.

DESCRIPTION OF THE RELATED ART

Active developments on light emitting devices using GaN based materials are being made nowadays. Blue and green high luminance light emitting diodes (LED) have been manufactured to date. Oscillation of a royal purple laser at a room temperature has been realized by many research organizations including the present inventor, and studies of manufacturing the products of this laser are made vigorously. A GaN based laser using a sapphire ($Al_2O_3$) substrate was manufactured and continuous wave oscillation (CW oscillation) during 1000 hours was confirmed (refer to S. Nakamura et al., Japanese Journal of Applied Physics, vol. 35, p. L74, 1996).

A manufacture method for a short wavelength semiconductor layer using a sapphire substrate will be described briefly. First, an a sapphire substrate having (0001) plane as its principal surface, a GaN buffer layer is formed at a low temperature. A method of forming this GaN buffer layer will be described with reference to FIGS. 39 to 42.

As shown in FIG. 39, on the principal surface of the (0001) plane of a sapphire substrate, a GaN layer 201 is grown to a thickness of 1 to 2 μm by metal organic vapor phase epitaxy (MOVPE). On the surface of the GaN layer 201, a $SiO_2$ film is deposited to a thickness of 100 to 300 nm by chemical vapor deposition (CVD). This $SiO_2$ film is patterned by using hydrofluoric acid to leave striped $SiO_2$ patterns 202. After the $SiO_2$ film is patterned, the substrate surface is cleaned satisfactorily with water.

As shown in FIG. 40, a GaN layer is grown on the substrate surface by MOVPE. At the initial growth stage, a GaN layer 203 is grown only in an area where the GaN layer 201 is exposed. As the growth of the GaN layer continues, as shown in FIG. 41 a GaN layer 204 starts being deposited also on the $SiO_2$ pattern 202.

As the growth continues further, adjacent GaN layers contact each other and the GaN layer covers the whole substrate surface. A GaN buffer layer 205 having generally a flat surface can be formed eventually, as shown in FIG. 42.

FIG. 43 is a schematic diagram showing the state of dislocations in the GaN buffer layer 205. Because of lattice mismatch between sapphire and GaN, dislocations 206 and 207 extend from the interface between the sapphire substrate 200 and GaN layer 201 into the GaN layer 201. The dislocation 206 in the region where the $SiO_2$ pattern 202 is formed does not extend above the $SiO_2$ pattern 202. In the region where the $SiO_2$ pattern 202 is not formed, the dislocation 207 extends into the GaN buffer layer 205.

A region 208 above the $SiO_2$ pattern 202 was formed by a lateral growth of GaN. Therefore, dislocation does not enter this region 208 above the $SiO_2$ pattern 202, and the dislocation density in this region 208 becomes low.

As shown in FIG. 44, a $SiO_2$ pattern 209 and a GaN buffer layer 210 may be formed by repeating the processes shown in FIGS. 39 to 42. In this case, as viewed along a substrate normal line direction, the $SiO_2$ pattern 209 is disposed approximately superposed upon the region where the $SiO_2$ pattern 202 is not disposed.

Extension of the dislocations 207 in the GaN buffer layer 205 is stopped by the $SiO_2$ pattern 209. It is therefore possible to form the second-layer GaN buffer layer 210 having a low dislocation density on the GaN buffer layer 205. With this manufacture method, although the dislocation density of the GaN buffer layer can be lowered, the number of processes increases so that the manufacture cost rises.

Next, a method of forming a laser structure on a GaN buffer layer will be described. On the GaN layer, a laminated structure is formed including an n-type GaN intermediate layer, an n-type $Al_{0.09}Ga_{0.91}N$ clad layer, an n-type GaN light guide layer (separated confinement hetero structure (SCH) layer), an InGaN multiple quantum well layer, a p-type $Al_{0.18}Ga_{0.82}N$ overflow preventing layer, a p-type GaN light guide layer, a p-type $Al_{0.09}Ga_{0.91}N$ clad layer, and a p-type GaN contact layer. These layers are grown, for example, by MOVPE.

The p-type GaN contact layer and p-type AlGaN clad layer are partially dry-etched to leave a ridge structure. The n-type GaN intermediate layer is partially exposed in an area where the ridge structure is not left. A $SiO_2$ film is formed covering the whole substrate surface. This $SiO_2$ film is patterned to expose a partial upper surface of the ridge structure and a partial surface of the n-type GaN intermediate layer. On the exposed surface of the ridge structure, a p-side electrode is formed having a two-layer structure of Ni/Au. On the exposed surface of the n-type GaN intermediate layer, an n-side electrode is formed having a two-layer structure of Ti/Au. Lastly, a pair of parallel side surfaces constituting resonator side surfaces is formed by dry etching.

The resonator side surfaces are formed by dry etching because it is difficult to cleave a sapphire substrate. Flatness of the resonator side surfaces formed by etching is worse than those formed by cleavage. Therefore, a threshold current of a short wavelength semiconductor laser using a sapphire substrate becomes larger than that of a semiconductor laser whose resonator side surfaces are formed by cleavage. For example, the threshold current density of the semiconductor laser formed by the above method is about 3.6 $kA/cm^2$.

The n-side electrode cannot be formed on the bottom surface of the sapphire substrate because sapphire has no electric conductivity. It is therefore necessary to expose the surface of the n-type GaN intermediate layer and form the n-side electrode on this exposed surface.

In order to solve the problems essentially associated with using a sapphire substrate, it has been proposed to use a SiC substrate (refer to A. Kuramata, K. Domen, R. Soejima, K. Horono, S. Kubota and T. Tanahasi, Japanese journal of Applied Physics Vol. 36 (1997) L1130, and G. E. Bulman et al, Device Research Conference IV-B-8, 1997).

With reference to FIG. 45, a method of manufacturing a semiconductor laser using a SiC substrate will be described.

A hexagonal 6H-SiC substrate 231 is prepared which has a (000.1) Si plane as its principal surface. The SiC substrate 231 is given n-type conductivity. Sequentially grown by MOVPE on the surface of the SiC substrate 231 are an n-type $Al_{0.1}Ga_{0.9}N$ buffer layer 232, an n-type GaN buffer layer 233, an n-type $Al_{0.09}Ga_{0.91}N$ clad layer 234, an n-type GaN light guide layer 235, an InGaN multiple quantum well layer 236, a p-type $Al_{0.18}Ga_{0.82}N$ electron block layer 237, a p-type GaN light guide layer 238, a p-type $Al_{0.09}Ga_{0.91}N$ clad layer 239, and a p-type GaN contact layer 240.

The AlGaN buffer layer 232 is 0.15 µm thick, the GaN buffer layer 233 is 0.1 µm thick, the AlGaN clad layer 234 is 0.5 µm thick, and the GaN light guide layer 235 is 0.1 µm thick. These n-type layers are doped with Si impurities at a concentration of $3\times10^{18}$ cm$^{-3}$.

The InGaN multiple quantum well layer 236 has the lamination structure of four barrier layers of undoped $In_{0.03}Ga_{0.97}N$ and three well layers of undoped $In_{0.15}Ga_{0.85}N$ alternately stacked. The barrier layer is 5 nm thick and the well layer is 4 nm thick. Five barrier layers each having a thickness of 5 nm and four well layers each having a thickness of 2.6 nm may also be used.

The AlGaN electron block layer 237 is 20 nm thick, the GaN light guide layer 238 is 0.1 µm thick, the AlGaN clad layer 239 is 0.5 µm thick, and the GaN contact layer 240 is 0.2 µm thick. These p-type layers are doped with Mg impurities at a concentration of $5\times10^{19}$ cm$^{-3}$.

The p-type GaN contact layer 240 and p-type AlGaN clad layer 239 are partially etched to leave a ridge 241 long in one direction. The ridge 241 is 3.5 µm wide. On the bottom surface of the SiC substrate 231, Ni, Ti and Au are sequentially deposited to form an n-side electrode 243. The surfaces of the ridge 241 and p-type AlGaN clad layer 239 are covered with a $SiO_2$ film 242.

An opening is formed through the $SiO_2$ film 242 to expose an upper surface of the ridge 241. On the exposed surface of the ridge 241 and on the $SiO_2$ film 242, Ni, Ti and Au are sequentially deposited to form a p-side electrode 244. The substrate is cleaved to form a GaN based semiconductor laser having the resonator length of 700 µm.

Since a SiC substrate can be cleaved, a high performance optical resonator can be manufactured easily. Since SiC has electric conductivity, the electrode can be disposed on the bottom surface of the substrate. The device structure can therefore be simplified. Since a difference of lattice constants between SiC and GaN is small, it is possible to epitaxially grown a GaN layer having a small lattice defect density. Since a heat dissipation coefficient of SiC is larger than that of sapphire, use of a SiC substrate is effective for improving the thermal dissipation characteristics.

By using the dislocation reduction method described with FIGS. 39 to 42, a GaN buffer layer having a low dislocation density can be formed for a semiconductor layer using a SiC substrate. The $SiO_2$ pattern 202 used by the dislocation reduction method is an insulating member so that current will not flow through the $SiO_2$ pattern 202 and the device resistance increases.

DISCLOSURE OF THE INVENTION

It is an object of the present invention to provide a semiconductor laser and its manufacture method, capable of suppressing an increase of a device resistance and lowering a dislocation density.

It is another object of the present invention to provide a semiconductor device having a semiconductor region of a low dislocation density and its manufacture method.

According to one aspect of the present invention, there is provided a semiconductor laser comprising: a substrate made of SiC; a plurality of $Al_xGa_{1-x}N$ patterns ($0 \leq x \leq 1$) formed on a surface of the substrate and dispersively distributed in an in-plane of the substrate; an $Al_yGa_{1-y}N$ buffer layer (y<x) covering the surface of the substrate and the $Al_xGa_{1-x}N$ patterns; and a laser structure formed on the $Al_yGa_{1-y}N$ buffer layer.

According to another aspect of the present invention, there is provided a method of manufacturing a semiconductor laser, comprising the steps of: growing an $Al_xGa_{1-x}N$ layer ($0 \leq x \leq 1$) on a substrate made of SiC; selectively etching the $Al_xGa_{1-x}N$ layer to partially expose the substrate; selectively growing an $Al_yGa_{1-y}N$ buffer layer (y<x) by using a remaining portion of the $Al_xGa_{1-x}N$ layer as seed crystals; and forming a laser structure on the $Al_yGa_{1-y}N$ buffer layer.

Since the AlGaN buffer layer is grown by using the AlGaN patterns as seed crystals, a dislocation density of a predetermined region in the AlGaN buffer layer can be lowered. The characteristics of a laser structure can be improved by forming the laser structure above the region having a low dislocation density. Since the AlGaN pattern has electric conductivity, the device resistance can be suppressed from being increased.

According to another aspect of the present invention, there is provided a method of manufacturing a semiconductor laser, comprising the steps of: depositing a silicon oxide film on a substrate made of SiC, selectively etching the silicon oxide film to partially expose a surface of the substrate; selectively growing an $Al_xGa_{1-x}N$ layer ($0 \leq x \leq 1$) on the exposed surface of the substrate; removing a remaining portion of the silicon oxide film; selectively growing an $Al_yGa_{1-y}N$ buffer layer (y<x) by using the selectively grown $Al_xGa_{1-x}N$ layer as seeds; and forming a laser structure on the $Al_yGa_{1-y}N$ buffer layer.

Since the $Al_yGa_{1-y}N$ buffer layer is grown by using the $Al_xGa_{1-x}N$ layer as seed crystals, a dislocation density of a predetermined region in the $Al_xGa_{1-x}N$ buffer layer can be lowered. The silicon oxide film can be removed by wet etching. If the silicon oxide film is etched by wet etching, the surface of the underlying exposed SiC substrate is damaged less. Crystallinity of the $Al_yGa_{1-y}N$ buffer layer can be improved further.

According to another aspect of the present invention, there is provided a nitride based group III-V compound semiconductor device, comprising: a semiconductor substrate; a lamination pattern formed on a partial surface of the semiconductor substrate, the lamination pattern including a lower-level layer made of nitride based group III-V compound semiconductor and a higher-level layer made of different material from the nitride based group III-V compound semiconductor; and a grown layer covering the lamination pattern, the grown layer being made of nitride based compound semiconductor easier to be grown on side walls of the lower-level layer than on a surface of the higher-level layer.

According to another aspect of the present invention, there is provided a method of manufacturing a semiconductor device, comprising the steps of: forming a lamination pattern on a partial surface of a semiconductor substrate, the lamination pattern including a lower-level layer made of nitride based group III-V compound semiconductor and a higher-level layer made of different material from the nitride based group III-V compound semiconductor; and selectively growing a growth layer from exposed side walls of the lower-level layer of the lamination pattern by using the lower-level layer as seed crystals, the growth layer being made of nitride based group III-V compound semiconductor.

The grown layer grows by using the lower-level layer of the lamination pattern as seed crystals. Namely, the grown layer is formed by the lateral growth. Therefore, the dislocation density of the grown layer lowers.

According to another aspect of the present invention, there is provided a semiconductor laser comprising: a semiconductor substrate; a buffer layer disposed on a partial surface of the semiconductor laser, the buffer layer being made of group III-V compound semiconductor and including an eaves portion; and a laser structure formed on the buffer layer, an oscillation region of the laser structure being disposed so as to be superposed upon the eaves portion, as viewed along a direction normal to a surface of the semiconductor substrate.

According to another aspect of the present invention, there is provided a method of manufacturing a semiconductor device, comprising the steps of: forming a mask film with openings on a surface of a semiconductor substrate; selectively forming semiconductor buffer regions on surfaces of the semiconductor substrate exposed in the openings, and laterally growing the buffer regions also on surfaces of the mask film near the openings; removing the mask film; and growing a semiconductor layer on surfaces of the buffer regions and the semiconductor substrate.

The buffer region formed on the mask by the lateral growth has a low dislocation density. The semiconductor layer formed on the region having a low dislocation density has also a low dislocation density. As the mask film is removed, the eaves portion is left above the removed region. As compared to covering the whole substrate surface with the buffer region, cracks are hard to be generated in the buffer region.

According to another aspect of the present invention, there is provided a semiconductor laser comprising: a semiconductor substrate; an AlGaN pattern formed on a partial surface of the semiconductor substrate, the AlGaN pattern being made of $Al_xGa_{1-x}N$ ($0 \leq x \leq 1$), a buffer layer made of $Al_yGa_{1-y}N$ ($y<x$) and covering a surface of the AlGaN pattern and surfaces of the semiconductor substrate on both sides of the AlGaN pattern; a semiconductor layer covering a surface of the buffer layer and surfaces of the semiconductor substrate on both sides of the buffer layer; and a laser structure formed on the buffer layer, an oscillation region of the laser structure being disposed so as not to be superposed upon the AlGaN pattern as viewed along a direction normal to the surface of the semiconductor substrate.

According to another aspect of the present invention, there is provided a method of manufacturing a semiconductor laser, comprising the steps of: forming an AlGaN pattern on a partial surface of a semiconductor substrate, the AlGaN pattern being made of $Al_xGa_{1-x}N$ ($0 \leq x \leq 1$); selectively growing a buffer layer made of $Al_yGa_{1-y}N$ ($y<x$) by using the AlGaN pattern as seed crystals; and stopping the selective growing step before the selectively grown buffer layer covers a whole surface of the semiconductor substrate.

Since the AlGaN buffer layer is grown by using the AlGaN layer as seed crystals, a dislocation density of a predetermined region in the AlGaN buffer layer can be lowered. As compared to covering the whole substrate surface with the AlGaN buffer layer, cracks are hard to be generated in the AlGaN buffer layer.

According to another aspect of the present invention, there is provided a nitride based group III-V compound semiconductor device, comprising: a semiconductor substrate; a lamination pattern formed on a partial surface of the semiconductor substrate, the lamination pattern including a lower-level layer made of nitride based group III-V compound semiconductor and a higher-level layer made of different material from the nitride based group III-V compound semiconductor; and a buffer region made of nitride based compound semiconductor and covering a surface of the lamination pattern and surfaces of the semiconductor substrate on both sides of the lamination pattern, the nitride based compound semiconductor being easier to grow on side walls of the lower-level layer than on a surface of the higher-level layer.

According to another aspect of the present invention, there is provided a method of manufacturing a semiconductor device comprising the steps of: forming a lamination pattern on a partial surface of a semiconductor substrate, the lamination pattern including a lower-level layer made of nitride based group III-V compound semiconductor and a higher-level layer made of different material from the nitride based group III-V compound semiconductor; selectively growing a buffer region made of nitride based group III-V compound semiconductor by using exposed side walls of the lower-level layer of the lamination pattern as seed crystals, and laterally growing the buffer region also on a surface of the higher-level layer of the lamination pattern to cover the surface of the higher-level layer and the partial surface of the semiconductor substrate; and stopping the step of selectively growing the buffer region before the buffer region covers a whole surface of the semiconductor substrate.

Since the buffer region is laterally grown from the side walls of the lower-level layer of the lamination pattern, the buffer region having a low dislocation density can be formed. As compared to covering the whole surface of the semiconductor substrate with the buffer region, cracks are hard to be generated in the buffer region.

BRIEF DESCRIPTION OF THE DRAWINGS

FIGS. 25 to 27 are cross sectional views of a substrate illustrating examples of some processes of a method of manufacturing a semiconductor laser, these processes being used as reference to technical features.

BEST MODES FOR EMBODYING THE INVENTION

With reference to FIGS. 1 to 5, a method of manufacturing a semiconductor laser according to the first embodiment of the invention will be described.

Figure 1:
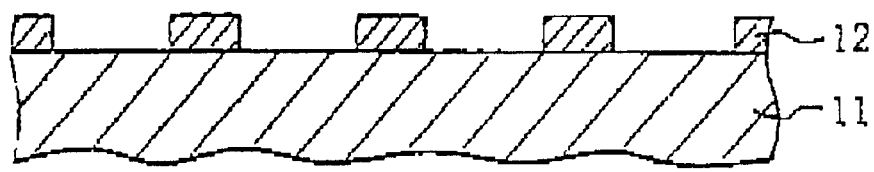
FIGS. 1 to 4 are cross sectional views of a substrate illustrating some processes of a method of manufacturing a semiconductor laser according to a first embodiment of the invention.

As shown in FIG. 1, a SiC substrate 11 having a (0001) Si plane as its principal surface is cut from a hexagonal 6H-SiC bulk grown by an improved Rayleigh method. The SiC substrate 11 is doped with n-type impurities at a carrier concentration of $2\times10^{18}$ cm$^{-3}$.

On the SiC substrate, an n-type $Al_{0.1}Ga_{0.9}N$ layer is grown having an impurity concentration of $8\times10^{18}$ cm$^{-3}$ and a thickness of 100 nm. The thickness may be 50 to 300 nm and the impurity concentration may be $5\times10^{17}$ to $1\times10^{19}$ cm$^{-3}$. This AlGaN layer is grown by MOVPE. For example, trimethylgallium (TMGa), trimethylaluminum (TMAl) and ammonia are used as source gas, SiH$_4$ is used as source dopant and hydrogen is used as carrier gas. The growth conditions are a pressure of 100 Torr and a temperature of 1090° C. The pressure may be 70 to 760 Torr, and the temperature may be 800 to 1200° C.

The AlGaN layer is dry-etched to leave striped AlGaN patterns 12. The AlGaN pattern 12 is parallel to the <1–100> direction of the SiC substrate 11. In this specification, the index normally represented by "1 bar" is written as "–1". The width of the AlGaN pattern 12 is 4.0 μm and a distance (pattern pitch) between centers of adjacent AlGaN patterns 12 is 8.0 μm. The pattern width maybe set to 1.0 to 10.0 μm and the pitch may be set to 2.0 to 20.0 μm. The AlGaN layer may be patterned by wet etching using H$_3$PO$_4$ or NaOH. If the AlGaN layer is patterned by wet etching, the side etch amount becomes large. It is therefore necessary to properly manage an etching precision.

Figure 2:
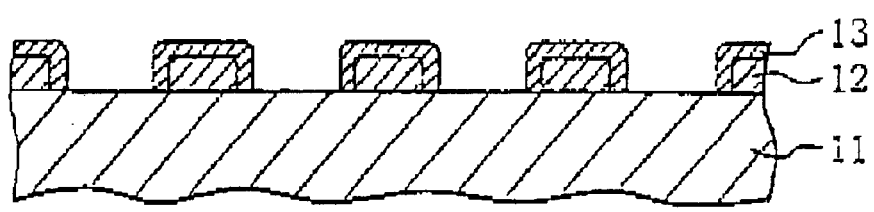

As shown in FIG. 2, an n-type GaN layer 13 is grown having an impurity concentration of $8\times10^{18}$ cm$^{-3}$. The impurity concentration may be set to $5\times10^{17}$ to $1\times10^{19}$ cm$^{-3}$. This GaN layer is grown also by MOVPE. For example, TMGa and ammonia are used as source gas, SiH$_4$ is used as source dopant, and hydrogen is used as carrier gas. The growth conditions are a pressure of 100 Torr and a temperature of 1090° C. The pressure may be 70 to 760 Torr, and the temperature may be 800 to 1200° C.

Growth seeds are not likely to be formed on the exposed surface of the n-type SiC substrate. Therefore, at the initial growth stage, the GaN layer 13 grows only on the surface of the AlGaN pattern 12.

Processes of forming the structure shown in FIG. 3 will be described. As the growth of the GaN layer 13 shown in FIG. 2 continues, the GaN layer 13 grows also in the lateral direction. As the GaN layer 13 grows to a thickness of about 0.5 μm, adjacent GaN layers 13 are coupled together. An n-type GaN buffer layer 14 covering the whole substrate surface is eventually formed. For example, the GaN buffer layer 14 has a thickness of 4.0 μm. The thickness of the GaN buffer layer 14 may be 0.5 to 20.0 μm. As the thickness of the GaN buffer layer 14 becomes about 1.0 μm, the surface thereof becomes approximately flat.

Figure 4:
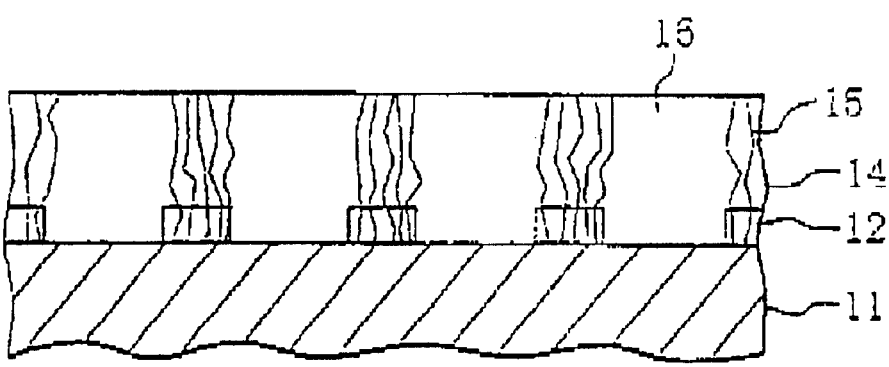

FIG. 4 is a schematic diagram showing dislocations 15 in the GaN buffer layer 14. The dislocations 15 extending from the n-type SiC substrate 11 pass through the AlGaN pattern 12 and enter the GaN buffer layer 14. Since the dislocations 15 extend upward, the dislocations 15 do not exist in a region 16 of the GaN layer 14 formed by lateral direction growth, or even if they exist, the amount of dislocations is small.

Figure 3:
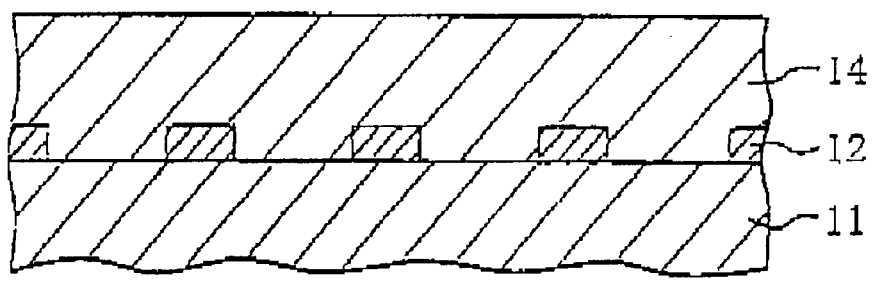
Figure 5:
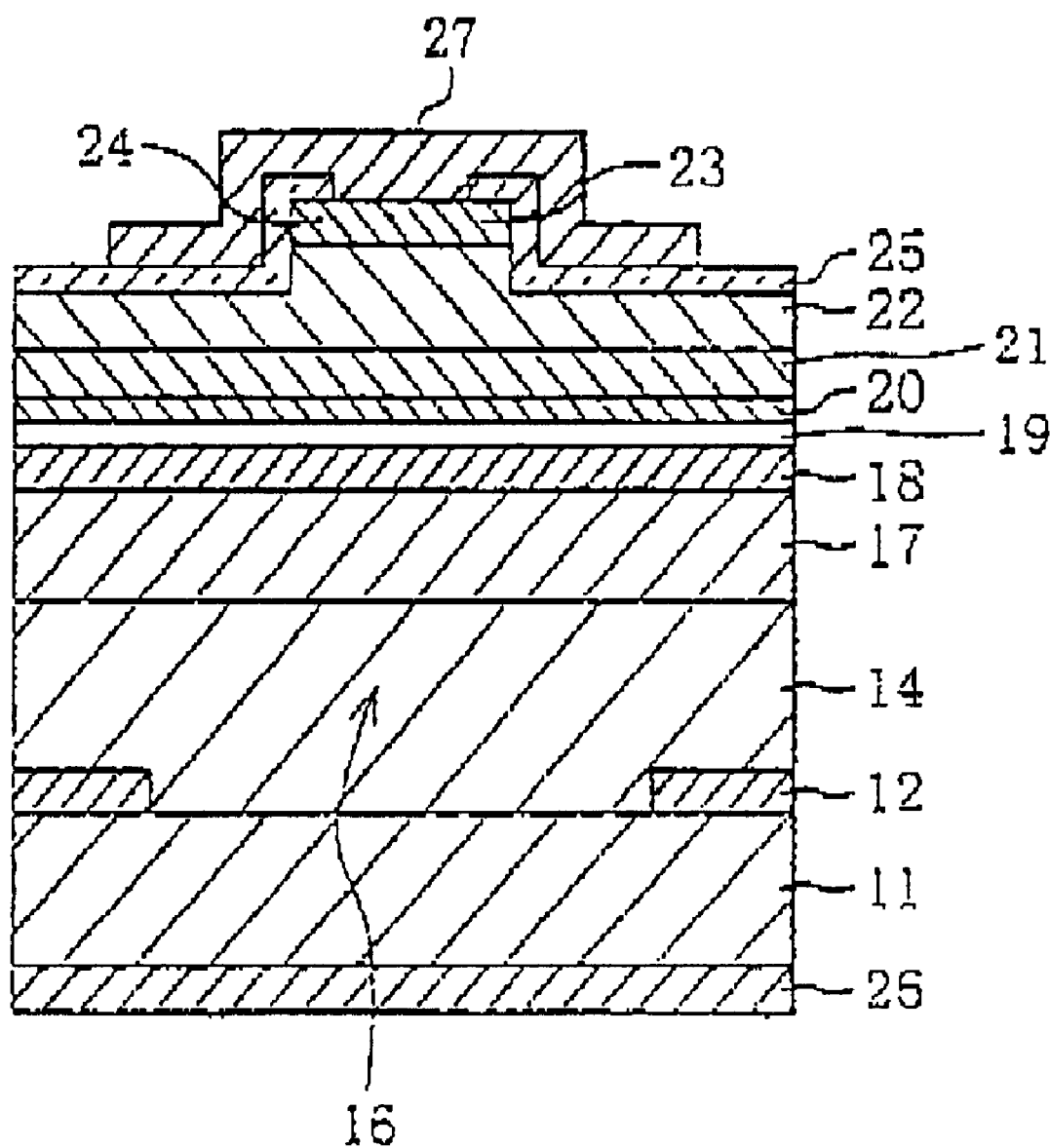
FIG. 5 is a cross sectional view of a semiconductor layer of the first embodiment.

FIG. 5 is a cross sectional view of a region sandwiched between the centers of adjacent AlGaN patterns 12 shown in FIG. 3. On the GaN buffer layer 14, an n-type $Al_{0.09}Ga_{0.91}N$ clad layer 17 is grown having an impurity concentration of $3.0\times10^{18}$ cm$^{-3}$ and a thickness of 0.5 μm. The impurity concentration may be set to $1.0\times10^{17}$ to $1.0\times10^{20}$ cm$^{-3}$ and the thickness may be set to 0.1 to 2.0 μm. The growth of the AlGaN layer 17 is performed also by MOVPE. For example, TMAl, TMGa and ammonia are used as source gas, SiH$_4$ is used as source dopant, and hydrogen is used as carrier gas. The growth conditions are a pressure of 100 Torr and a temperature of 1090° C. The pressure may be 70 to 760 Torr, and the temperature may be 800 to 1200° C.

On the AlGaN clad layer 17, an n-type GaN light guide layer 18 is grown having an impurity concentration of $3.0\times10^{18}$ cm$^{-3}$ and a thickness of 100 nm. The impurity concentration may be set to $1.0\times10^{17}$ to $1.0\times10^{20}$ cm$^{-3}$ and the thickness may be set to 10 to 300 nm. The growth of the GaN light guide layer 18 is performed also by MOVPE. The source gas, source dopant, carrier gas, pressure conditions and temperature conditions are similar to those used for the growth of the GaN buffer layer 14.

On the GaN light guide layer 18, a multiple quantum well layer 19 is formed. The multiple quantum well layer 19 is a lamination of undoped $In_{0.03}Ga_{0.97}N$ barrier layers and undoped $In_{0.16}Ga_{0.85}N$ well layers alternately stacked. Four barrier layers and three well layers are used to form the multiple quantum well layer 19. Two to ten well layers may be used. The barrier layer has a thickness of 5 nm and the well layer has a thickness of 4 nm, The thickness of the barrier layer may be set to 1 to 10 nm and the thickness of the well layer may be set to 3 to 10 nm.

The growth of the barrier and well layers is performed by MOVPE. Triethylgallium (TEGa), trimethylindium (TMIn) and ammonia are used as source gas, and nitrogen is used as carrier gas. The growth conditions are a pressure of 100 Torr and a temperature of 780° C. The pressure may be 70 to 760 Torr, and the temperature may be 550 to 900° C.

On the multiple quantum well layer 19, a p-type $Al_{0.18}Ga_{c.82}$ electron block layer 20 is grown having a thickness of 20 nm and an impurity concentration of $5\times10^{19}$ cm$^{-3}$. The impurity concentration may be set to $1.5\times10^{19}$ cm$^{-3}$ or larger and the thickness may be set to 5 to 30 nm.

The growth of the AlGaN electron block layer 20 is performed also by MOVPE. TMAl, TMGa and ammonia are used as source gas, biscyclopentadienyl magnesium ($Cp_2Mg$) is used as source dopant, and nitrogen is used as carrier gas. The pressure and temperature conditions are similar to those used for the growth of the AlGaN clad layer 17.

On the AlGaN electron block layer 20, a p-type GaN light guide layer 21 is grown having a thickness of 100 nm and an impurity concentration of $5.0 \times 10^{19}$ cm$^{-3}$. The impurity concentration may be set to $1.0 \times 10^{17}$ to $5.0 \times 10^{19}$ cm$^{-3}$ and the thickness may be set to 10 to 300 nm. The growth of the GaN light guide layer 21 is performed also by MOVPE. TMGa and ammonia are used as source gas, $Cp_2Mg$ is used as source dopant, and nitrogen is used as carrier gas. The pressure and temperature conditions are similar to those used for the growth of the GaN buffer layer 14.

On the GaN light guide layer 21, a p-type $Al_{0.09}Ga_{0.91}N$ clad layer 22 is grown having a thickness of 0.5 μm and an impurity concentration of $5.0 \times 10^{19}$ cm$^{-3}$. The impurity concentration may be set to $1.0 \times 10^{17}$ to $5.0 \times 10^{19}$ cm$^{-3}$ and the thickness may be set to 0.1 to 2.0 μm. The growth of the AlGaN clad layer 22 is performed also by MOVPE. The source gas, source dopant, carrier gas, pressure conditions and temperature conditions are similar to those used for the growth of the AlGaN electron block layer 20.

On the AlGaN clad layer 22, a p-type GaN contact layer 23 is grown having a thickness of 0.2 μm and an impurity concentration of $5.0 \times 10^{19}$ cm$^{-3}$. The impurity concentration may be set to $1.0 \times 10^{17}$ to $5.0 \times 10^{19}$ cm$^{-3}$ and the thickness may be set to 0.1 to 2.0 μm. The growth of the GaN contact layer 23 is performed also by MOVPE. The source gas, source dopant, carrier gas, pressure conditions and temperature conditions are similar to those used for the growth of the GaN light guide layer 21.

The bottom surface of the SiC substrate 11, is polished to thin the substrate to about 100 μm. The GaN contact layer 23 and AlGaN clad layer 22 are partially dry-etched to leave a ridge 24. The ridge 24 is 3.5 μm wide and 0.4 μm high. As viewed along a substrate normal line direction, the ridge 24 is disposed not superposed upon the AlGaN pattern 12.

On the bottom surface of the SiC substrate 11, Ni, Ti and Au are sequentially deposited to form an n-side electrode 26 having a three-layer structure of Ni/Ti/Au. The surfaces of the ridge 24 and AlGaN clad layer 22 are covered with an $SiO_2$ film 25. An opening is formed through the $SiO_2$ film 25 to expose a partial upper surface of the ridge 24. For example, a width of this opening is 2.0 μm. Ni, Ti and Au are sequentially deposited on the $SiO_2$ film 25 and on the ridge 24 exposed on the bottom of the opening to form an n-side electrode having a three-layer structure of Ni/Ti/Au.

The SiC substrate 11 is cleaved so that a resonator length of 700 μm is set. The (1–100) plane of the SiC substrate 11 appears on the cleaved surface.

In the MOVPE process, the growth speed of the n-type layer is set to 2 μm/h, the growth speed of the InGaN multiple quantum well layer 19 is set to 0.3 μm/h, and the growth speed of the p-type layer is set to 1 μm/h.

In the first embodiment described above, the n-type AlGaN patterns 12 having electric conductivity are used as seed crystals, and the region 16 having a small number of dislocations is formed by lateral growth. Since the laser oscillation region is disposed above the region 16 having a small number of dislocations, reliability of the semiconductor laser can be improved.

Under the laser oscillation region, the n-type GaN buffer layer 14 directly contacts the n-type SiC substrate 11. Since the relative resistivity of the n-type GaN buffer layer 14 is smaller than that of the n-type AlGaN pattern 12, the device resistance can be lowered.

Next, with reference to FIGS. 6 to 9, the method of manufacturing a semiconductor laser according to the second embodiment will be described.

Figure 6:
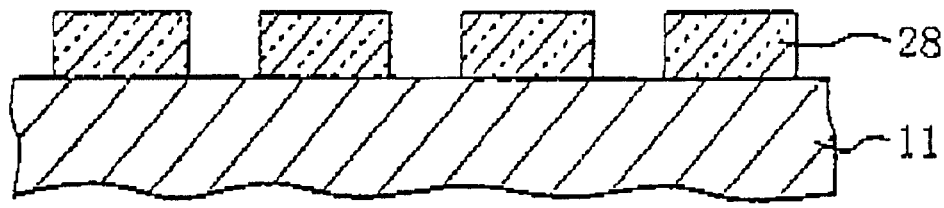
FIGS. 6 to 9 are cross sectional views of a substrate illustrating some processes of a method of manufacturing a semiconductor laser according to a second embodiment of the invention.

An SiC substrate 11 shown in FIG. 6 is similar to the SiC substrate 11 of the first embodiment shown in FIG. 1 An $SiO_2$ film is formed on the surface of the SiC substrate 11 to a thickness of 200 nm by thermal chemical vapor deposition (thermal CVD). The thickness of the $SiO_2$ film may be set to 100 to 500 nm. This $SiO_2$ film is selectively etched by using hydrofluoric acid to leave striped $SiO_2$ masks 28.

The width of the $SiO_2$ mask 28 is 4.0 μm and a distance (pitch) between centers of adjacent $SiO_2$ masks 28 is 8.0 μm. The $SiO_2$ mask width may be set to 1.0 to 10.0 μm and the pitch may be set to 2.0 to 20.0 μm.

Figure 7:
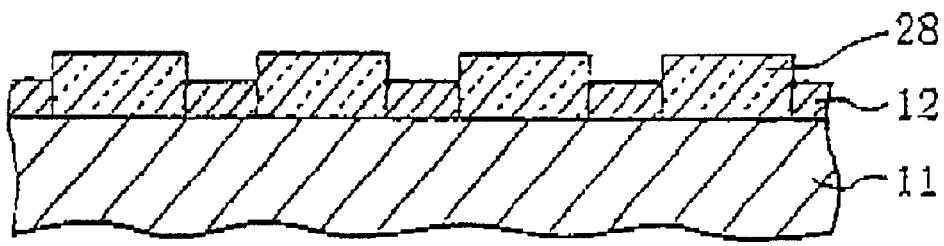

As shown in FIG. 7, an n-type $Al_{0.1}Ga_{0.9}N$ layer 12 having a thickness of 100 nm and an impurity concentration of $8 \times 10^{18}$ cm$^{-3}$ is selectively grown on the exposed surface of the SiC substrate 11. The thickness of the AlGaN layer 12 may be set to 50 to 300 nm and the impurity concentration may be set to $5 \times 10^{17}$ to $1 \times 10^{19}$ cm$^{-3}$. The growth conditions are similar to those used for the growth of the AlGaN pattern 12 shown in FIG. 1.

Figure 8:
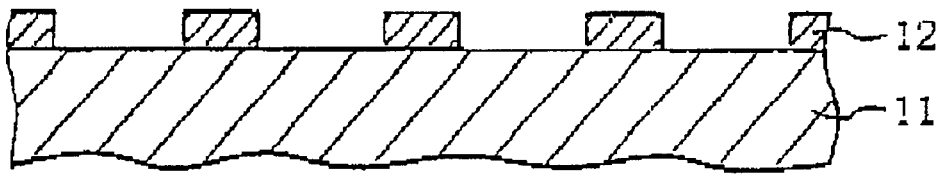

As shown in FIG. 8, the $SiO_2$ masks 28 are removed by using hydrofluoric acid. Striped n-type AlGaN patterns 12 are left on the surface of the SiC substrate 11.

Figure 9:
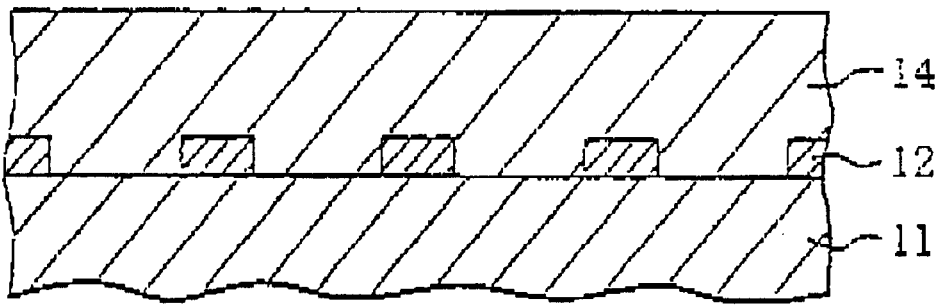

As shown in FIG. 9, by using the AlGaN patterns 12 as seed crystals, an n-type GaN buffer layer 14 is grown. The growth conditions are similar to those used for the growth of the GaN buffer layer 3 shown in FIG. 3. With these processes, the structure similar to that of the first embodiment shown in FIG. 3 can be obtained. On the GaN buffer layer 14 shown in FIG. 9, a laser structure similar to that of the first embodiment shown in FIG. 5 is formed.

In the second embodiment, the $SiO_2$ masks 28 are removed by the process shown in FIG. 8 through wet etching. In contrast, in the first embodiment, the AlGaN layer is patterned by the process shown in FIG. 1 through dry etching. Therefore, in the second embodiment, damages of the exposed surface of the SiC substrate 11 can be reduced more than the first embodiment. Crystallinity of the GaN buffer layer grown on the SiC substrate can be improved.

Next with reference to FIGS. 10 and 11, the third embodiment will be described.

Figure 10:
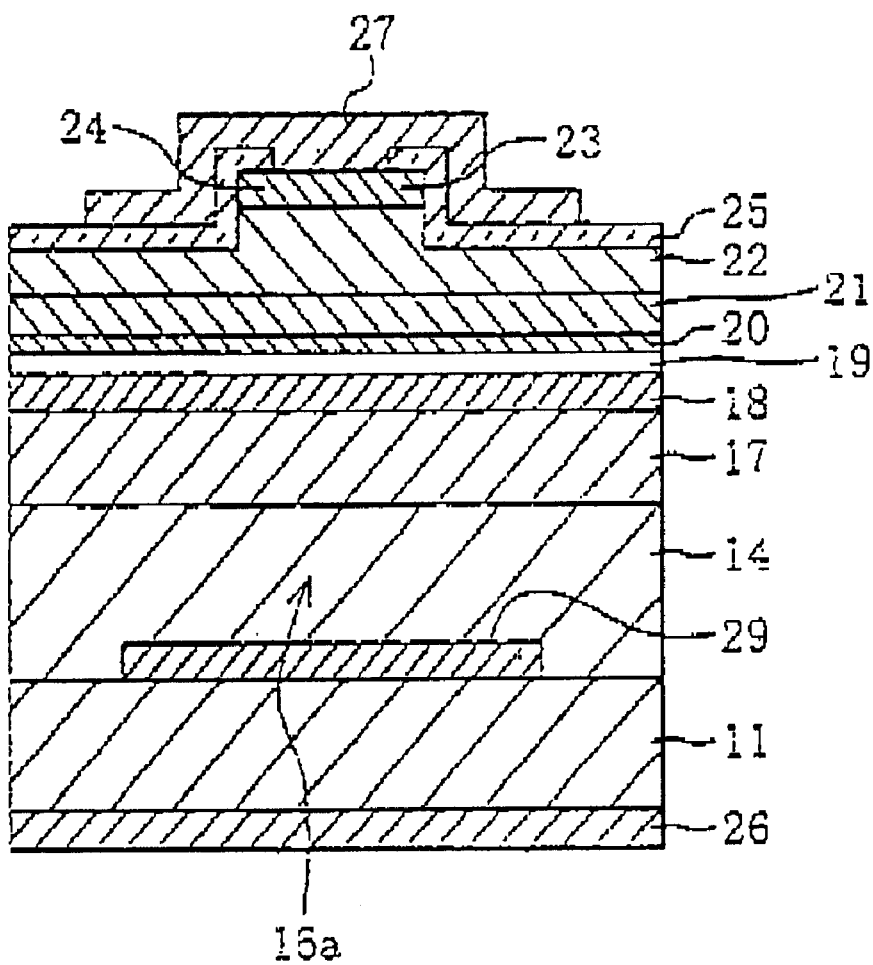
FIG. 10 is a cross sectional view of a semiconductor layer according to a third embodiment.

As shown in FIG. 10, on the surface of an n-type SiC substrate 11, an n-type AlGaN pattern 29 is formed. The SiC substrate 11 is similar to the SiC substrate of the first embodiment shown in FIG. 1. The n-type AlGaN pattern 29 is formed by a method similar to that used for forming the AlGaN pattern 12 of the first embodiment shown in FIG. 1. Although the AlGaN pattern 12 shown in FIG. 1 is parallel to the <1–100> direction of the SiC substrate 11, the AlGaN pattern 29 of the second embodiment is parallel to the <11–20> direction of the SiC substrate 11. The AlGaN pattern 29 has a thickness of 100 nm, a width of 4.0 μm, a pitch of 8.0 μm and an impurity concentration of $8 \times 10^{18}$ cm$^{-3}$. The pattern may be set so that it has the thickness of 50 to 300 nm, the width of 1.0 to 10.0 μm, the pitch of 20 to 20.0 μm and the impurity concentration of $5 \times 10^{17}$ to $1 \times 10^{19}$ cm$^{-3}$.

By using the AlGaN patterns 29 as growth seeds, an n-type GaN buffer layer 14 is grown having a thickness of 4.0 μm and an impurity concentration of $8 \times 10^{18}$ cm$^{-3}$. The thickness may be set to 0.5 to 20.0 μm and the impurity concentration may be set to $5 \times 10^{17}$ to $1 \times 10^{19}$ cm$^{-3}$.

Figure 11:
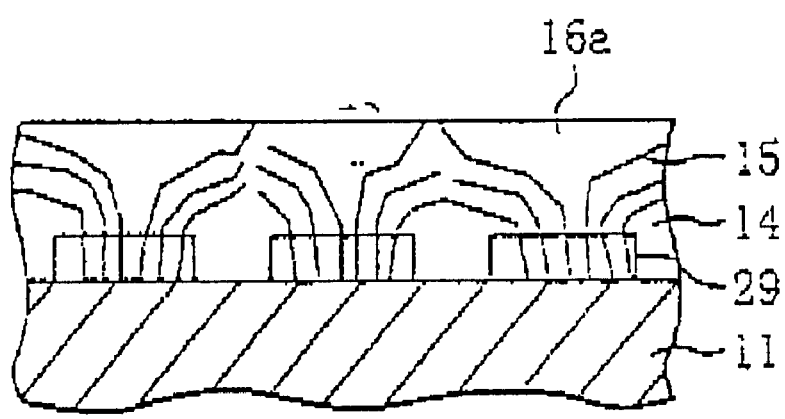
FIG. 11 is a cross sectional view schematically showing dislocations in a buffer layer of the semiconductor laser of the third embodiment.

FIG. 11 is a schematic diagram showing dislocations 15 in the GaN buffer layer 14. In the first embodiment, the dislocations 15 extend upward as shown in FIG. 4. In the third embodiment, the dislocations 15 extend laterally. A region 16a above the AlGaN pattern 29 has a small number of dislocations.

Reverting to FIG. 10, on the n-type GaN buffer layer 14, a laser structure similar to the first embodiment shown in FIG. 5 is formed. In the third embodiment, as viewed along the substrate normal line direction, the ridge 24 is disposed so as not to be superposed upon the AlGaN pattern 29. The resonator surface formed by cleavage has the (11–20) plane.

In the third embodiment, the laser oscillation region is disposed above the low dislocation density region 16a. Therefore, similar to the first embodiment, reliability of the semiconductor laser can be improved. Since the AlGaN pattern 29 having a resistance higher than GaN is disposed under the laser oscillation region, the device resistance may be higher than that of the first embodiment.

In the first to third embodiments described above, $Al_{0.1}Ga_{0.9}N$ is used as seed crystals for the selective growth. It is not necessarily required to set the Al composition ratio to 10%. The Al composition ratio may be set as $0 \leq x \leq 1$. Namely, GaN or AlN may be used as seed crystals.

However, if the Al composition ratio x is smaller than 0.09, it is difficult to grow AlGaN crystal, and if the Al composition ratio x is larger than 0.4, the relative resistivity increases and the device resistance increases. It is therefore preferable to set the Al composition ratio as $0.09 \leq x \leq 0.40$. If the Al composition ratio is set smaller than 0.09, crystal growth can be realized by lowering the growth temperature In the first to third embodiments described above, although the GaN layer is used as the low-level buffer layer for forming the laser structure, an $Al_y Ga_{1-y}N$ layer may be used generally. If a relation y<x is satisfied where x is the Al composition ratio of the AlGaN layer used as seed crystals and y is the Al composition ratio of the buffer layer, then selective growth can be performed easily. It is therefore preferable to satisfy the relation y<x. If the Al composition ratio y of the buffer layer is small, direct growth on the exposed surface of the n-type substrate becomes difficult. If the Al composition ratio x of $Al_x Ga_{1-x}N$ used as seed crystals is 0, i.e., if GaN is used as seed crystals, the Al composition ratio y of the buffer layer is set to 0, i.e., the buffer layer is also made of GaN.

In the first to third embodiments described above, although the multiple quantum well layer has the laminated structure of $In_{0.15}Ga_{0.85}N$ layers and $In_{0.03}Ga_{0.97}N$, the crystal mixture ratio may be changed depending upon a desired wavelength. For example, x and y of a mixed crystal $Al_x Ga_y In_{1-x-y}N$ may be changed in the ranges of $0 \leq x < 1$ and $0 < y \leq 1$. As the crystal mixture ratio of the multiple quantum well layer is changed, a and b of the light guide layer and clad layer $Al_a Ga_b In_{1-a-b}$ may be changed in the ranges of $0 \leq a \leq 1$ and $0 \leq b \leq 1$.

Next, with reference to FIGS. 12 to 19, the fourth embodiment will be described.

Figure 12:
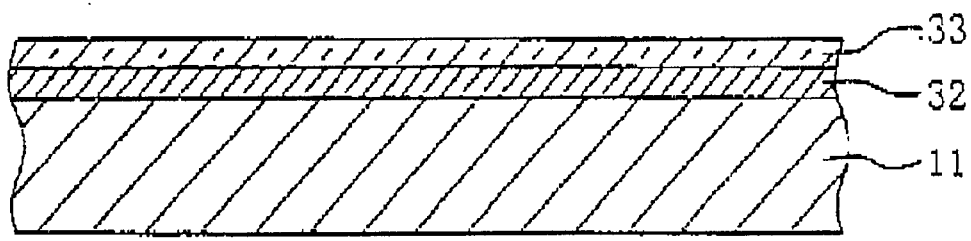
FIGS. 12 to 18 are cross sectional views of a substrate illustrating some processes of a method of manufacturing a semiconductor laser according to a fourth embodiment of the invention.

Processes of forming the structure shown in FIG. 12 will be described. A substrate 11 similar to the SiC substrate 11 of the first embodiment shown In FIG. 1 is washed by organic solution and then by water, and thereafter immersed in hydrofluoric acid for about 1 minute. The SiC substrate is picked up from hydrofluoric acid and again washed by water. The SiC substrate is then placed in a growth chamber of an MOVPE system.

After the inside of the growth chamber is evacuated, a heat treatment is executed at 1080° C. for 5 minutes in a hydrogen atmosphere. After the substrate temperature is lowered to 1050° C., an $Al_{0.1}Ga_{0.9}N$ layer 32 is grown to a thickness of 0.1 μm on the (0001) Si plane of the SiC substrate 11. The thickness of the AlGaN layer 32 may be set to 0.03 to 1.0 μm and the Al composition ratio may be set to 0.05 to 1. TMGa, TMAl and ammonia are used as source gas, and hydrogen is used as carrier gas. A flow rate of TMGa is set to 44 μmol/min, a flow rate of TMAl is set to 8 μmol/min, and a flow rate of ammonia is set to 0.1 mol/min.

While ammonia is flowed, the substrate is cooled to a substrate temperature of 600° C. or lower, and the inside of the growth chamber is replaced by nitrogen. The substrate is further cooled near to a room temperature and the SiC substrate 11 formed with the AlGaN layer 32 is taken out of the growth room. Next, an SiO$_2$ film 33 is deposited to a thickness of 0.2 μm on the AlGaN layer 32 by CVD.

Figure 13:
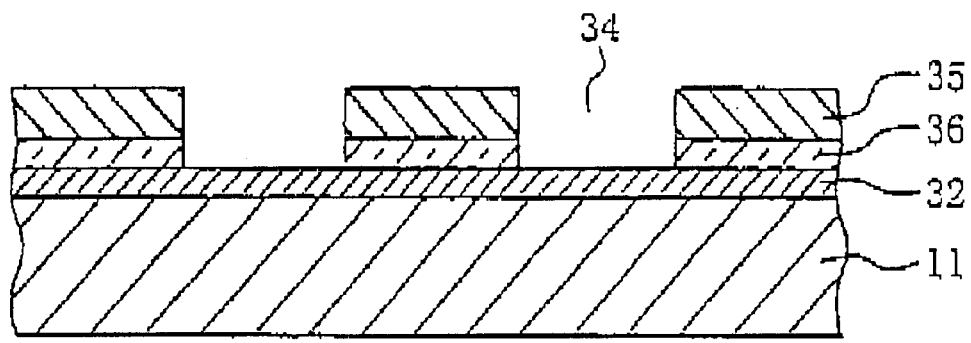

Processes of forming the structure shown in FIG. 13 will be described. Resist is coated on the surface of the SiO$_2$ film 33, and pre-baking is performed, for example, at 80° C. for 30 minutes. This resist film is exposed and developed to form striped resist patterns 35 having a pitch of 4 μm and an opening width of 2 μm. Post-baking of the resist patterns 35 is performed at 150° C. for 60 minutes.

By using the resist pattern 15 as a mask, the exposed portion of the SiO$_2$ 33 is etched by using hydrofluoric acid. SiO$_2$ patterns 36 are therefore left under the resist patterns 35. Thereafter, the resist patterns 35 are removed and the substrate is washed satisfactorily.

Figure 14:
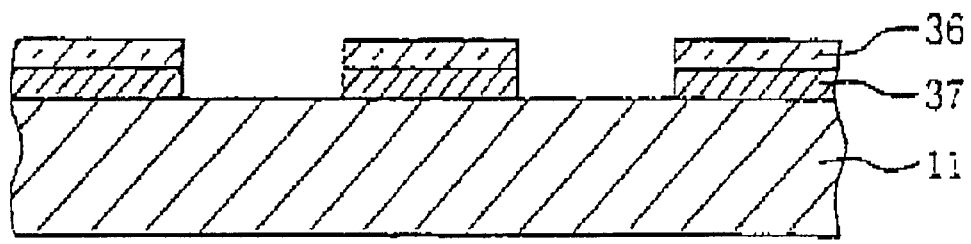

As shown In FIG. 14, by using the SiO$_2$ patterns 36 as a mask, the exposed AlGaN layer 32 is etched. This etching is performed by reactive ion etching using Cl$_2$. AlGaN patterns 37 are therefore left under the SiO$_2$ patterns.

Figure 15:
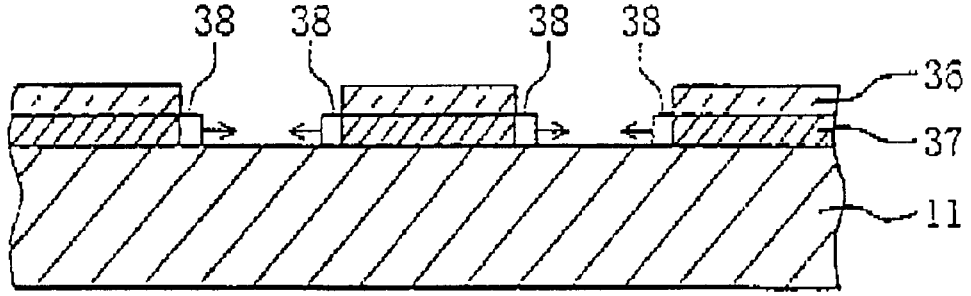

Processes of forming the structure shown in FIG. 15 will be described. The substrate is placed in a growth chamber of an MOVPE system. After the inside of the growth chamber is evacuated, a heat treatment is executed at 1080° C. for 5 minutes in a hydrogen atmosphere. After the substrate temperature is lowered to 1050° C., a GaN layer having an impurity concentration of $8 \times 10^{18}$ cm$^{-3}$ is grown. The impurity concentration may be set to $5 \times 10^{17}$ to $1 \times 10^{19}$ cm$^{-3}$. TMGa and ammonia are used as source gas, SiH$_4$ is used as source dopant, and hydrogen is used as carrier gas. A flow rate of TMGa is set to 44 μmol/min, and a flow rate of ammonia is set to 0.1 mol/min.

GaN crystal is difficult to be grown on the surfaces of the SiC substrate 11 and SiO$_2$ patterns 36. At the initial growth stage, crystal grows on the exposed surface of the AlGaN patterns 37, i.e., only on the side walls thereof. With the lateral growth, a GaN grown layer 38 is formed on the side wall of the AlGaN pattern 37. Since the GaN grown layer 38 is formed by the lateral growth, dislocations formed by lattice mismatch between the SiC substrate 11 and GaN crystal do not enter the GaN grown layer 38. The dislocation density In the GaN grown layer is therefore low.

Figure 16:
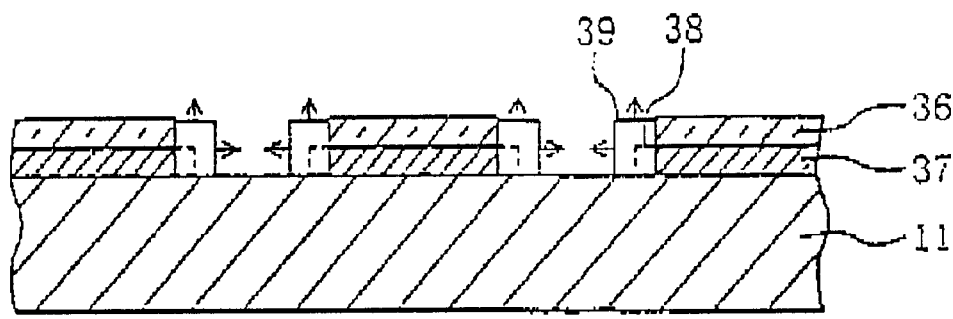
Figure 17:
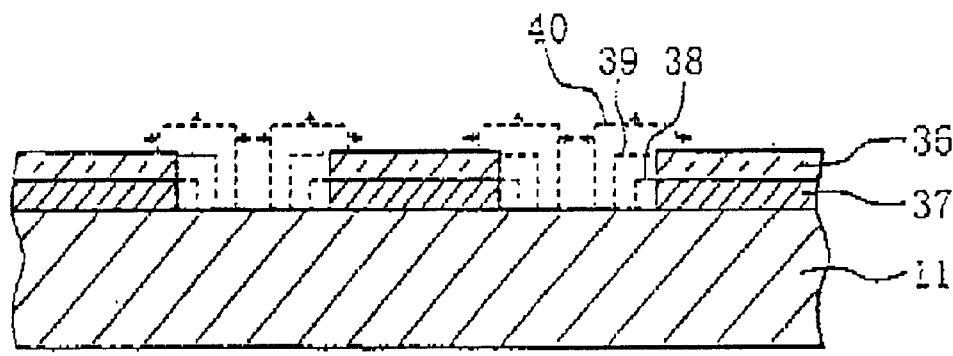

As shown In FIG. 16, as the crystal growth continues, a GaN grown layer 39 is formed through lateral growth and vertical growth by using the GaN grown layers 38 as seeds. After the height of the grown crystal layer exceeds the upper surface of the SiO$_2$ pattern, lateral growth starts even on the upper surface of the SiO$_2$ pattern. In this manner, as shown in FIG. 17 a GaN grown layer 40 is formed.

Dislocations extending upward from the interface between the SiC substrate 11 and AlGaN pattern 37 are blocked by the SiO$_2$ pattern 36. Since the GaN grown layer over the SiO$_2$ pattern 36 is grown by the lateral growth, dislocations to be formed by lattice mismatch or thermal expansion coefficient difference between SiO$_2$ and GaN are hard to be formed in the GaN grown layer. As the growth further continues, adjacent GaN grown layers 40 are coupled.

Figure 18:
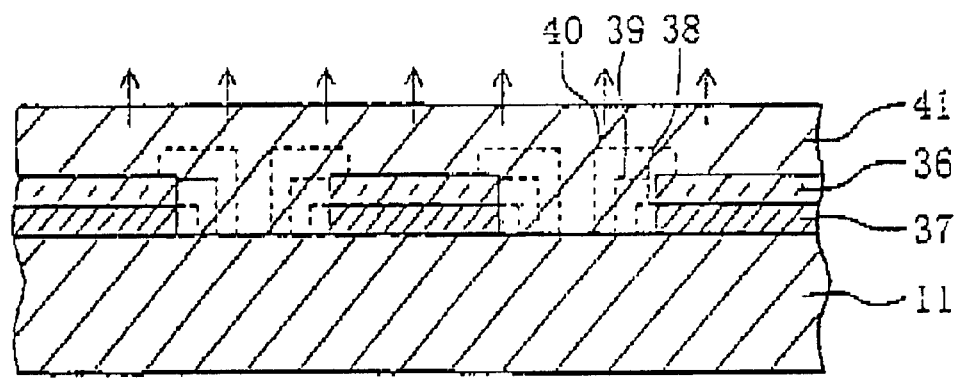

As shown in FIG. 18, a GaN buffer layer 41 is therefore formed. The growth continues until the thickness of the GaN layer 41 becomes 2.5 μm. The thickness of the GaN buffer layer 41 may be set to 2.0 to 10.0 μm. When the thickness of the GaN buffer layer 41 becomes a half of the pitch of the SiO$_2$ patterns 36, the surface thereof becomes generally flat.

While ammonia is flowed, the substrate is cooled to a substrate temperature of 600° C. or lower, and the inside of the growth chamber is replaced by nitrogen. The substrate is further cooled near to a room temperature and thereafter the substrate is taken out of the growth room.

With the above processes, the GaN buffer layer 41 having a small number of dislocations can be formed.

Figure 19:
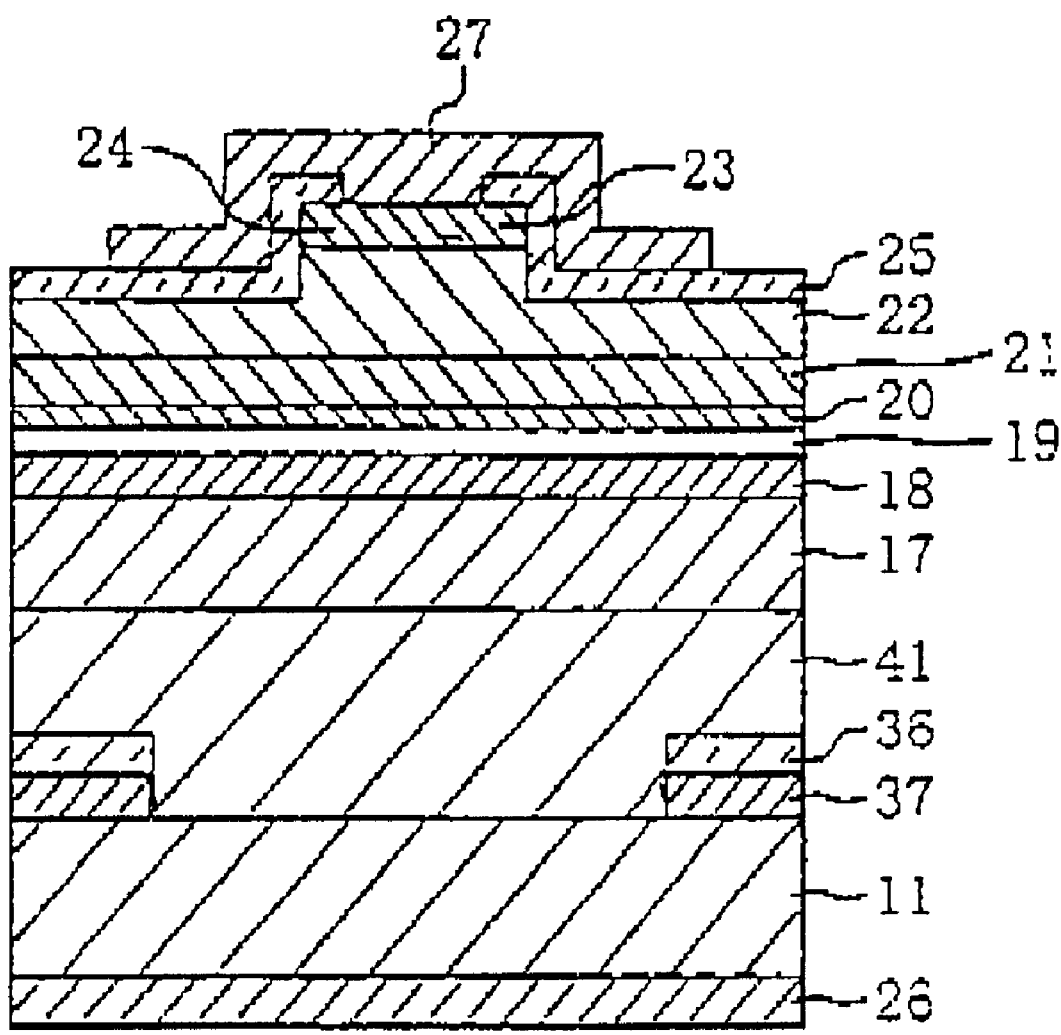
FIG. 19 is a cross sectional view of a semiconductor layer of the fourth embodiment.

FIG. 19 is a cross sectional view of a semiconductor laser having a laser structure formed an the GaN buffer layer 41. The laser structure is similar to that of the first embodiment shown in FIG. 1. In FIG. 19, like constituent elements to those shown in FIG. 5 are represented by identical reference numerals. As viewed along a substrate normal line direction, the ridge 24 is disposed so as not to be superposed upon the SiO$_2$ pattern 36.

The semiconductor laser of the fourth embodiment has a double hetero junction structure formed on the GaN buffer layer 41 having a low dislocation density. Therefore, epitaxial growth layers having good crystallinity can be formed and a semiconductor laser having a small threshold current density can be obtained.

The SiO$_2$ pattern 36 and AlGaN pattern 37 function as a current confinement layer. Current flows efficiently through the region just under the ridge 42, so that a lower threshold current density can be expected. Since the SiC substrate having electric conductivity is used, the process of forming an electrode on the substrate side can be simplified and a low manufacture cost can be realized.

Figure 24:
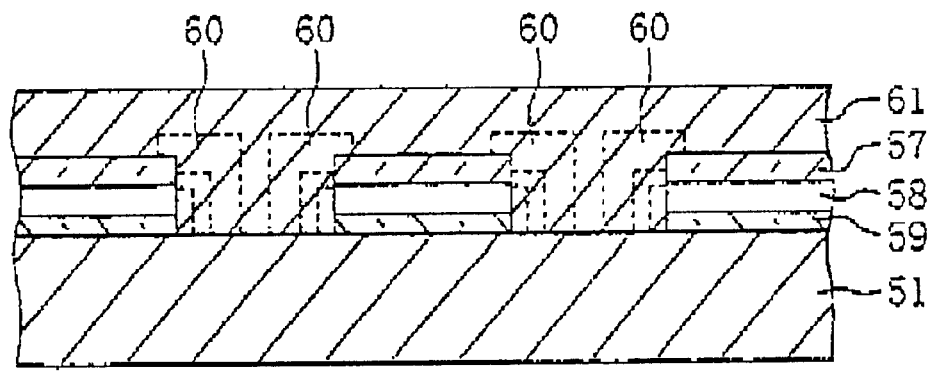

Next, with reference to FIGS. 20 and 24, the fifth embodiment will be described.

Figure 20:
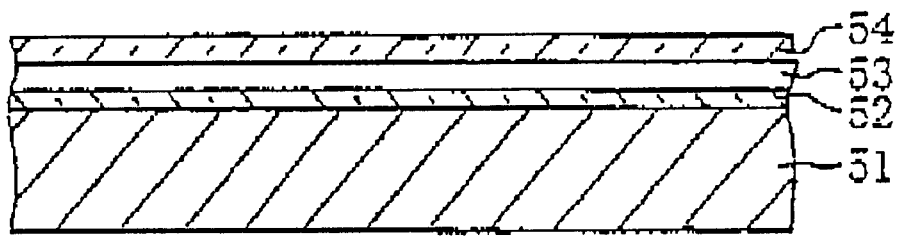
FIGS. 20 to 24 are cross sectional views of a substrate illustrating some processes of a method of manufacturing a semiconductor laser according to a fifth embodiment of the invention.

As shown in FIG. 20, an Si substrate 51 having the (111) plane as its principal surface is washed by organic solution and then by water, and thereafter immersed in hydrofluoric acid for about 1 minute. The substrate is again washed by water. The Si substrate 51 is then placed in a growth chamber of an MOVPE system. After the inside of the growth chamber is evacuated, a heat treatment is executed at 1080° C. for 5 minutes in a hydrogen atmosphere. After the substrate temperature is lowered to 900° C., an AlN layer 52 is grown to a thickness of 20 nm on the surface of the Si substrate 51. The thickness of the AlN layer 52 may be set to 10 to 100 nm. In growing the AlN layer 52, TMAl and ammonia are used as source gas, and hydrogen is used as carrier gas. A flow rate of TMAl is set to 8 μmol/min, and a flow rate of ammonia is set to 0.1 mol/min.

After the substrate is heated to 1050° C., a GaN layer 53 having a thickness of 0.1 μm is grown on the AlN layer 52. The thickness of the GaN layer 53 may be set to 0.05 to 0.5 μm. In growing the GaN layer 53, TMGa and ammonia are used as source gas, and hydrogen is used as carrier gas. A flow rate of TMGa is set to 44 μmol/min, and a flow rate of ammonia is set to 0.1 mol/min. Although it is difficult to grow a GaN layer directly on an Si substrate, the GaN layer can be grown by forming an AlN layer on the Si substrate.

While ammonia is flowed, the substrate is cooled to a substrate temperature of 600° C. or lower, and the inside of the growth chamber is replaced by nitrogen. The substrate is further cooled near to a room temperature and thereafter taken out of the growth room. Next, an SiO$_2$ film 54 is deposited to a thickness of 0.2 μm on the GaN layer 53 by CVD.

Figure 21:
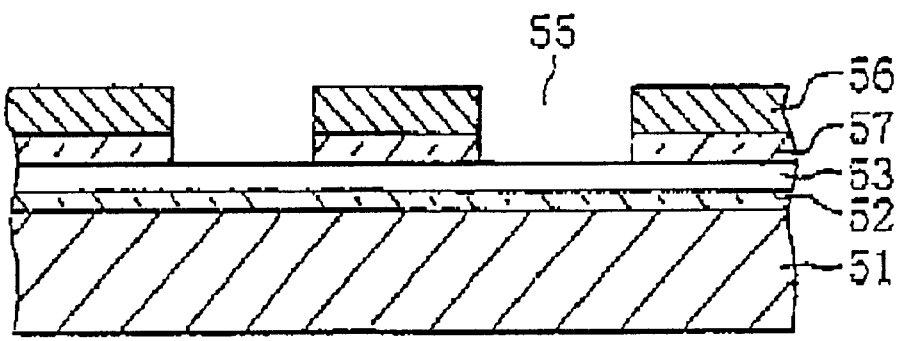

Processes of forming the structure shown in FIG. 21 will be described. Resist is coated on the surface of the SiO$_2$ film 54, and pre-baking is performed at 80 ° C. for 30 minutes. This resist film is exposed and developed to form striped resist patterns 56 having a pitch of 4 μm and an opening width of 2 μm. Next, post-baking is performed at 115° C. for 60 minutes. By using the resist pattern 56 as a mask, the exposed portion of the SiO$_2$ 54 is etched by using hydrofluoric acid. SiO$_2$ patterns 57 are therefore left under the resist patterns 56. After the SiO$_2$ film 54 is patterned, the resist patterns 56 are removed.

Figure 22:
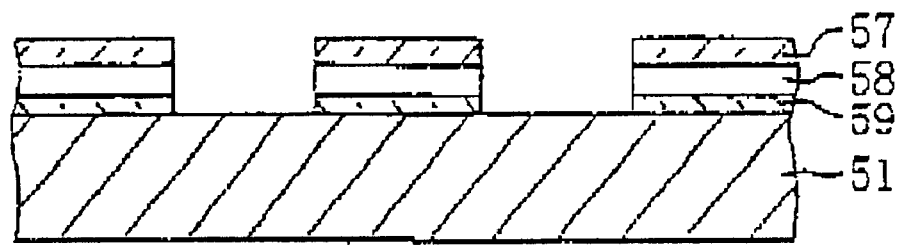

As shown in FIG. 22, by using the SiO$_2$ patterns 57 as a mask, the GaN layer 53 and AlN layer 52 are etched. This etching is performed by RIE using Cl$_2$. GaN patterns 58 and AlN patterns 59 are therefore left under the SiO$_2$ patterns 57.

Figure 23:
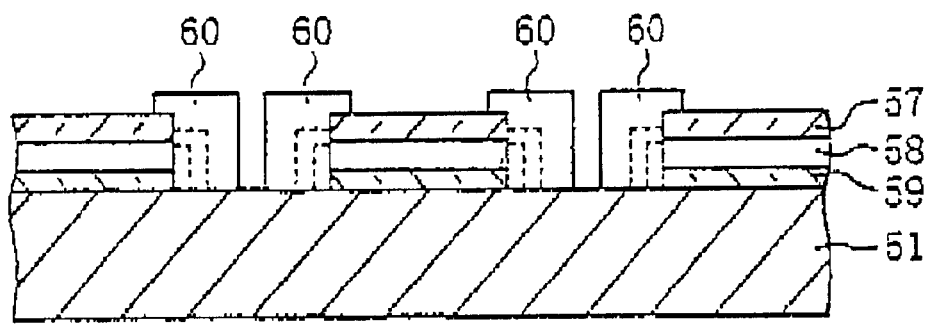

Processes of forming the structure shown in FIG. 23 will be described. The substrate formed with the GaN pattern 58 and AlN pattern 59 is placed in a growth chamber of an MOVPE system. After the inside of the growth chamber is evacuated, a heat treatment is executed at 1080° C. for 5 minutes in a hydrogen atmosphere. After the substrate temperature is lowered to 1050° C., a GaN layer is grown on the substrate surface. The growth conditions are similar to those used for growing the GaN layer 53 shown in FIG. 20.

Crystal grows only on the side walls of the GaN patterns 58. Therefore, a GaN grown layer 60 having a low dislocation density grows from the side walls of the GaN patterns 58 through lateral growth and vertical growth. A GaN buffer layer 61 shown in FIG. 24 is eventually formed. A thickness of the GaN buffer layer 61 is set to 2.5 μm. The thickness of the GaN buffer layer 61 may be set to 2.0 to 10.0 μm. After the GaN buffer layer 61 is formed, the substrate is taken out of the growth chamber. A laser structure similar to that shown in FIG. 19 is formed on the GaN buffer layer.

In the fifth embodiment, an Si substrate is used. Si substrates are inexpensive more than sapphire substrates and nitride based group III-V compound semiconductor substrates. Semiconductor lasers can therefore be made low in price.

In the fourth and fifth embodiments, GaN is used as the material of the buffer layer formed through the lateral growth. Instead, other nitride based group III-V compound semiconductors may also be used. For example, if Al$_x$Ga$_{1-x}$N is used as seed crystals for the lateral growth, the buffer layer may be made of Al$_y$Ga$_{1-y}$N. In this case, if material is selected so that the above-described relation of y<x is satisfied, selective growth can be performed easily. In order to facilitate the selective growth, it is preferable that x and y are selected to satisfy the relation of y<x. As the Al composition ratio y becomes lower, it becomes more difficult to grow crystal on the exposed surface of an SiC substrate or Si substrate. It becomes therefore easy to form a buffer layer having a low dislocation density through the lateral growth.

In the fourth and fifth embodiments, although SiO$_2$ is used as a selective growth mask for the buffer layer, other insulating materials may also be used. For example, SiN may be used which is chemically and thermally stable similar to SiO$_2$.

Next, the sixth embodiment will be described. In the first to fifth embodiments, the GaN buffer layer covering the whole substrate surface is formed by utilizing the lateral growth of GaN crystal. With this method, cracks may be formed in the GaN buffer layer and manufacture of a laser structure may become difficult. Generation of clacks may be ascribed to tensile stress generated in the GaN layer during cooling after crystal growth, because the thermal expansion coefficient of SiC is smaller than that of GaN.

The present inventors have fostered the idea that generation of cracks can be prevented by forming dispersively distributed GaN islands (ridges) without covering the substrate whole surface with a GaN layer formed through the lateral growth. Prior to describing the sixth embodiment, examples of forming dispersively distributed GaN islands (or ridges) will be described with reference to FIGS. 25 to 27.

As shown in FIG. 25, an AlGAN layer 72 is grown on an SiC substrate 71. As shown In FIG. 26, striped $SiO_2$ patterns 73 are formed on the AlGaN layer 72. On the exposed surface of the AlGaN layer 72, GaN layers 74 are selectively formed. With the lateral growth, GaN regions 74a having a low dislocation density are formed in an area near the side edges of each $SiO_2$ pattern 73. Growth is stopped before adjacent GaN layers 74 are coupled.

As shown in FIG. 27, a laser structure 75 is formed on the GaN layer 74, The oscillation region is disposed above the region 74a having a low dislocation density. It is expected that a semiconductor laser having a low threshold current density can be obtained. Since the GaN layer 74 is not formed on the whole substrate surface, the inventor has fostered the idea that generation of cracks can be suppressed.

When the laser structure 75 is formed, a semiconductor layer 76 is deposited on the $SiO_2$ pattern 73 exposed between adjacent GaN layers 74. Since the semiconductor layer is not epitaxially grown on the $SiO_2$ pattern 73, the semiconductor layer 76 is polycrystal. The polycrystal semiconductor layer 76 has large concave and convex surfaces. If electrodes and pads are formed on the semiconductor layer 76, they are likely to be peeled off because of the large concave and convex surfaces. Reliability of semiconductor lasers are therefore lowered.

With reference to FIGS. 28 to 31, a method of manufacturing a semiconductor laser according to the sixth embodiment will be described.

Processes of forming the structure shown in FIG. 28 will be described. An SiC substrate 81 used is similar to the SiC substrate 11 used by the first embodiment shown in FIG. 1. On this SiC substrate 81, an n-type AlGaN buffer layer 82 and a first buffer layer 83 of n-type GaN are grown by MOVPE. The AlGaN buffer layer 82 is 0.5 μm thick and has an impurity concentration of $6 \times 10^{18}$ cm$^{-3}$. The first buffer layer 83 is 0.1 μm and has an impurity concentration of $6 \times 10^{18}$ cm$^{-3}$.

On the first buffer layer 83, an $SiO_2$ film having a thickness of 0.2 μm is formed by thermal CVD. This $SiO_2$ film is selectively etched to form a plurality of openings 84a long in one direction. Selective growth masks 84 made of $SiO_2$ are therefore left. The openings 84a define a striped pattern. Each opening 84a has a width of 4 μm, and a distance between adjacent openings 84a is 30 μm. The longitudinal direction of the opening 84a is parallel to the <1–100> direction of the SiC substrate 81.

By using as crystal seeds the surfaces of the first buffer layer 83 exposed on the bottom of the openings 84a, a second buffer layer 85 of n-type GaN is selectively grown by MOVPE. An impurity concentration of the second buffer layer 85 is $3 \times 10^{17}$ cm$^{-3}$. With the lateral growth, the second buffer layer 85 is formed also on the surface of the selective growth mask 84. Dislocations extending from the surface of the first buffer layer 83 do not enter a region 85a formed through the lateral growth. This region 85a formed through the lateral growth has, therefore, a low dislocation density.

Crystal growth is stopped before the second buffer layers 85 grown from adjacent openings 84a are coupled. In this manner, dispersively distributed second buffer layers 86 are formed. A cross section of each of the second buffer layers 85 taken along a line perpendicular to the longitudinal direction has a T-character shape. The second buffer layer 85 formed on the surface of the selective growth mask 84 is 4 μm thick and 18 μm wide. The thickness and width of the second buffer layer 85 can be controlled independently by adjusting the flow rates of TMGa and ammonia during the growth, a growth temperature and a growth time.

Figure 29:
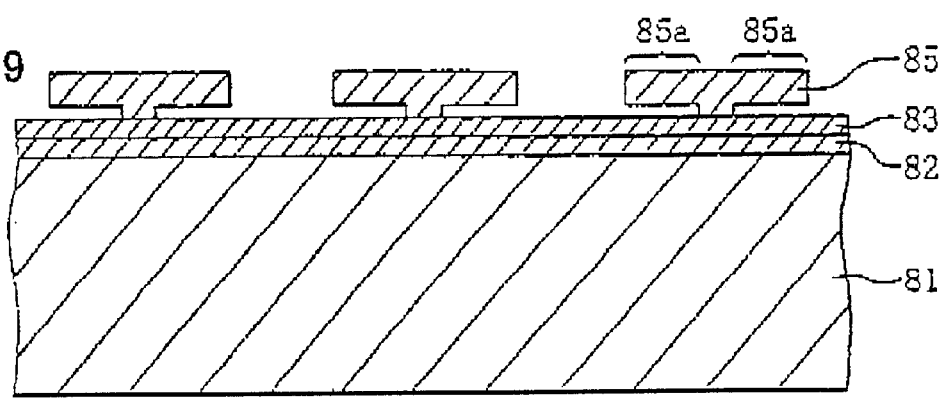

As shown in FIG. 29, the selective growth mask 84 is removed by using hydrofluoric acid. The region 85a formed through the lateral growth has the eaves structure.

Figure 30:
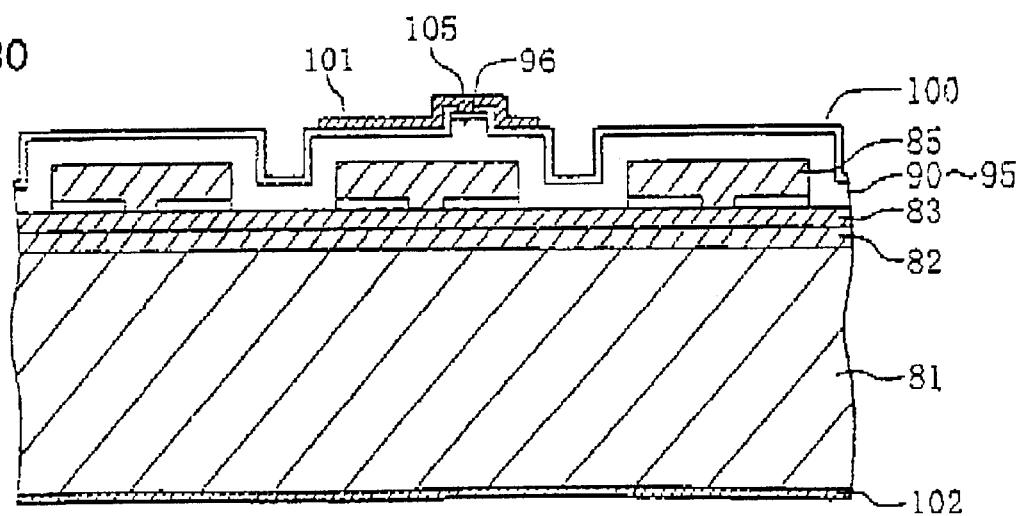
FIG. 30 is a cross sectional view of a semiconductor layer of the sixth embodiment.

As shown in FIG. 30, a laser structure is formed an the second buffer layer 85.

Figure 31:
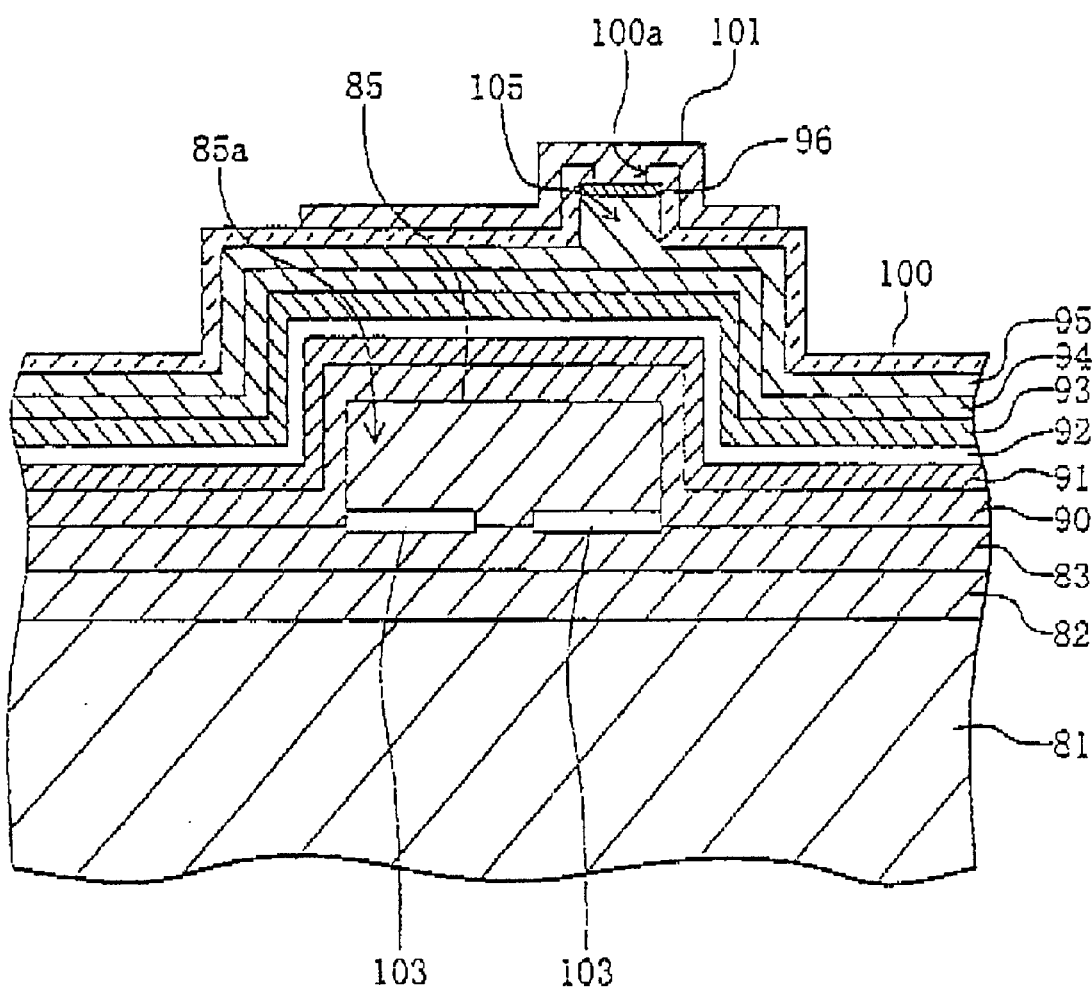
FIG. 31 is an enlarged cross sectional view of a laser structure of the semiconductor laser of the sixth embodiment.

FIG. 31 is a cross sectional view showing the details of the laser structure. An n-type AlGaN clad layer 90 is formed by MOCVD, covering the surfaces of the first and second buffer layers 83 and 85. The n-type AlGaN clad layer 90 is 1.2 μm thick and has an impurity concentration of $3 \times 10^{18}$ cm$^{-3}$ and an Al composition ratio of 9%.

On the n-type AlGaN clad layer 90, an n-type GaN light guide layer (separated confinement hetero structure layer (SCH layer)) 91 is grown by MOCVD. The n-type GaN light guide layer 91 is 0.1 μm thick and has an impurity concentration of $3 \times 10^{18}$ cm$^{-3}$.

On the n-type GaN light guide layer 91, a multiple quantum well layer 92 is grown by MOCVD. The multiple quantum well layer 92 is constituted by four barrier layers and three well layers. The barrier layer is made of InGaN having an in composition ratio of 3% and is 5 nm thick. The well layer is made of InGaN having an in composition ratio of 12%, and is 4 nm thick.

On the multiple quantum well layer 92, a p-type AlGaN electron barrier layer 93, a p-type GaN light guide layer 94, a p-type AlGaN clad layer 95 and a p-type GaN contact layer 96 are sequentially grown by MOCVD. The p-type AlGaN electron barrier layer 93 is 20 nm thick and has an impurity concentration of $5 \times 10^{17}$ cm$^{-3}$ and an Al composition ratio of 18%. The p-type GaN light guide layer 94 is 0.1 μm thick and has an impurity concentration of $5 \times 10^{17}$ cm$^{-3}$. The p-type AlGaN clad layer 95 is 0.6 μm thick and has an impurity concentration of $5 \times 10^{17}$ cm$^{-3}$ and an Al composition ratio of 9%. The p-type GaN contact layer 96 is 0.1 μm thick and has an impurity concentration of $1 \times 10^{18}$ cm$^{-3}$. An air gap 103 is defined under the eaves regions 85a formed through the lateral growth.

The p-type GaN contact layer 96 and p-type AlGaN clad layer 95 are partially etched to leave a ridge 105. The ridge 105 is 3 μm wide and 0.6 μm high. In an area where the ridge 105 is not formed, the lower layer of the p-type AlGaN clad layer 95 is left. As viewed along the substrate normal line direction, the ridge 105 is disposed so as to be superposed upon the region 85a formed through the lateral growth.

As shown in FIG. 30, the ridge 105 is disposed over one second buffer layer 85 among a plurality of second buffer layers 85. Second buffers 85 are formed, also in the areas where the ridge 105 is not disposed, in order to improve the reproductivity and reliability of selective growth.

Reverting to FIG. 31, an SiO₂ film 100 is deposited to a thickness of 0.2 μm, covering the p-type AlGaN clad layer 95 and ridge 105. An opening 100a is formed through the SiO₂ film 100, extending over the upper surface of the ridge 105. The opening 100a is 2 μm wide.

A p-side electrode 101 is formed on the surfaces of the SiO₂ film 100 and p-type GaN contact layer 96 exposed on the bottom of the opening 100. The p-side electrode 101 has the two-layer structure of a 0.1 μm thick Ni layer and a 0.1 μm thick Au layer laminated together. The p-side electrode 101 is patterned to have a desired shape.

As shown in FIG. 30, an n-side electrode 102 is formed on the bottom surface of the SiC substrate 81. The n-side electrode 102 is made of an Ni layer having a thickness of 0.2 μm.

The substrate is cleaved along the (1–100) plane perpendicular to the longitudinal direction of the second buffer 85. The length of the laser resonator formed by cleavage is 500 μm.

According to the sixth embodiment, the laser oscillation region is positioned above the region 85a having a low dislocation density and formed by the lateral growth. The dislocation density of the light radiation region lowers so that the threshold current can be reduced and a long lifetime of the device can be obtained. In the region where the second buffer layer 85 is not disposed, the n-type AlGaN clad layer 90 is epitaxially grown on the first buffer layer 83. A polycrystal layer is not therefore formed.

In the sixth embodiment, the second buffer layer 85 is 18 μm in width and 4 μm in thickness. According to the experiments by the present inventor, it has been found that as the second buffer layer 85 is made thick and wide, cracks are likely to be generated.

Figure 32:
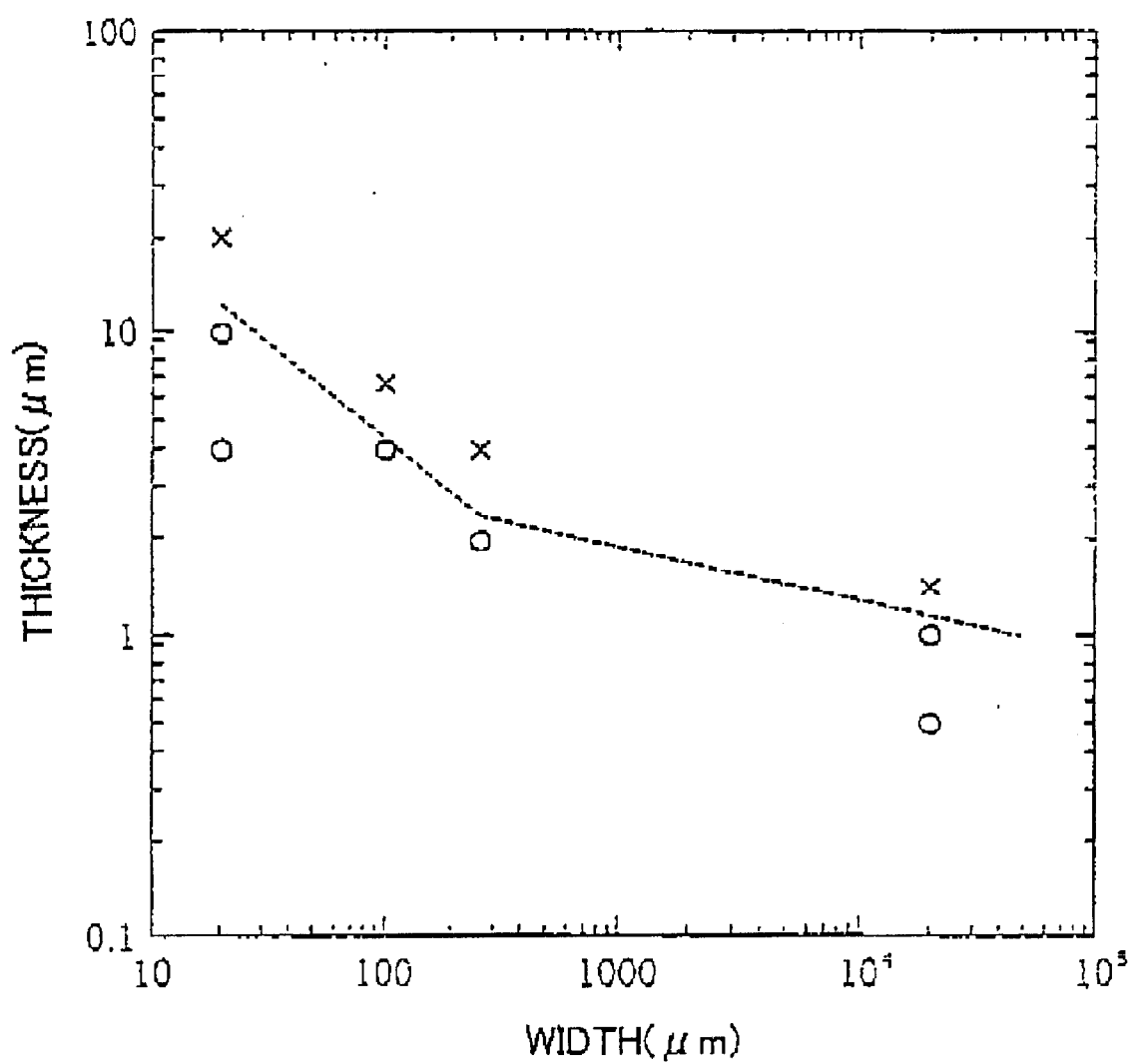
FIG. 32 is a graph showing the generation of cracks relative to parameters of a film thickness and an island width when the island of single crystal long in one direction is formed through lateral direction epitaxial growth.

FIG. 32 is a graph showing the generation of cracks by using the film thickness and width of the second buffer layer as parameters. The abscissa represents the width of the second buffer layer 85 in the unit of μm and the ordinate represents the thickness in the unit of μm. A white circle symbol in this graph indicates that no crack was generated, and a cross symbol indicates that cracks were generated. A broken line in this graph is a border line between the area where cracks were generated and the area where no crack was generated, i.e., indicates a critical film thickness. If the film thickness is thinner than this critical film thickness, no crack is generated. As seen from this graph, as the width of the second buffer layer is narrowed, the critical film thickness becomes thicker.

In order to maintain the sufficient effect of a dislocation density lowered by the lateral growth, it is preferable that the thickness of the second buffer layer is set to 4 μm or thicker. Of the region with the film thickness of 4 μm or thicker, the area where cracks are not generated is defined as:

$$\log T \leq -0.7 \times \log W + 2$$

It is preferable to set the thickness T[μm] and width W[μm] of the second buffer layer to satisfy the above inequality.

Figure 28:
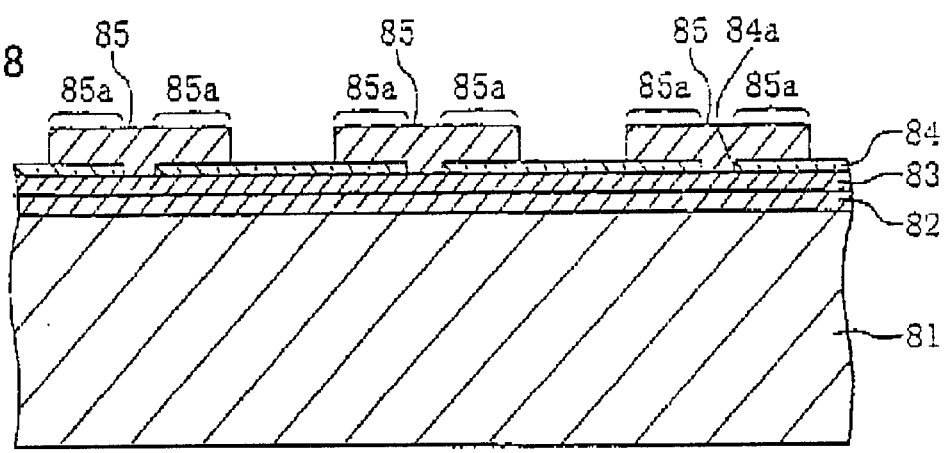
FIGS. 28 to 29 are cross sectional views of a substrate illustrating some processes of a method of manufacturing a semiconductor laser according to a sixth embodiment of the invention.

In the sixth embodiment, all the selective growth masks 84 shown in FIG. 28 are removed and air gaps are defined in the regions 85a formed through the lateral growth. In the structure shown in FIG. 28, only those exposed portions of the selective growth masks 84 may be removed to leave portions of the selective growth masks under the regions 85a formed through the lateral growth. In order to leave the portions of the selective growth masks 84, the selective growth masks 84 are etched by using buffered hydrofluoric acid.

Next, with reference to FIGS. 33 to 35, the seventh embodiment will be described.

Figure 33:
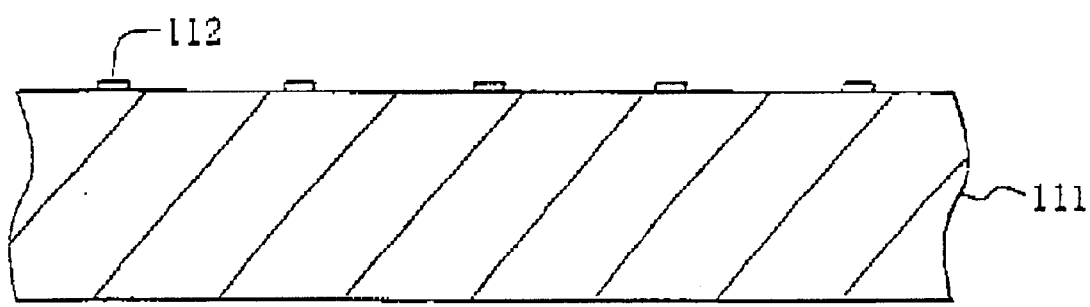
FIGS. 33 to 36 are cross sectional views of a substrate illustrating the processes of a method of manufacturing a semiconductor laser according to a seventh embodiment of the invention.

As shown in FIG. 33, on the surface of an SiC substrate 111, a plurality of AlGaN ridge patterns 112 are formed. The AlGaN pattern 112 is 0.1 μm thick and has an impurity concentration of 6×10¹⁸ cm⁻³ and an Al composition ratio of 9%. The width of each AlGaN pattern 112 is 4 μm and a pitch of AlGaN patterns 112 is 30 μm. The AlGaN pattern 112 may be formed by a process of forming the AlGaN pattern 112 of the first embodiment shown in FIG. 1, or by a process illustrated in FIGS. 6 to 8.

Figure 34:
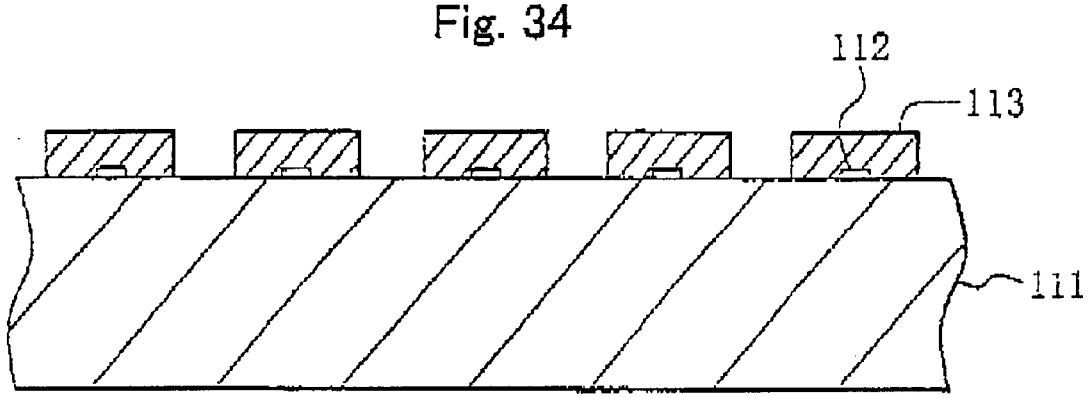

As shown in FIG. 34, by using the AlGaN patterns 112 as seed crystals, n-type GaN buffer layers 113 are selectively formed by MOVPE. Crystal growth is stopped before adjacent GaN buffer layers 113 grown from the AlGaN patterns are coupled together. The n-type GaN buffer layer 113 is 4 μm thick and 18 μm wide and has an impurity concentration of 3×10¹⁷ cm⁻³. As seen from FIG. 32, at this film thickness and width, cracks are not generated in the GaN buffer layer 113.

Figure 35:
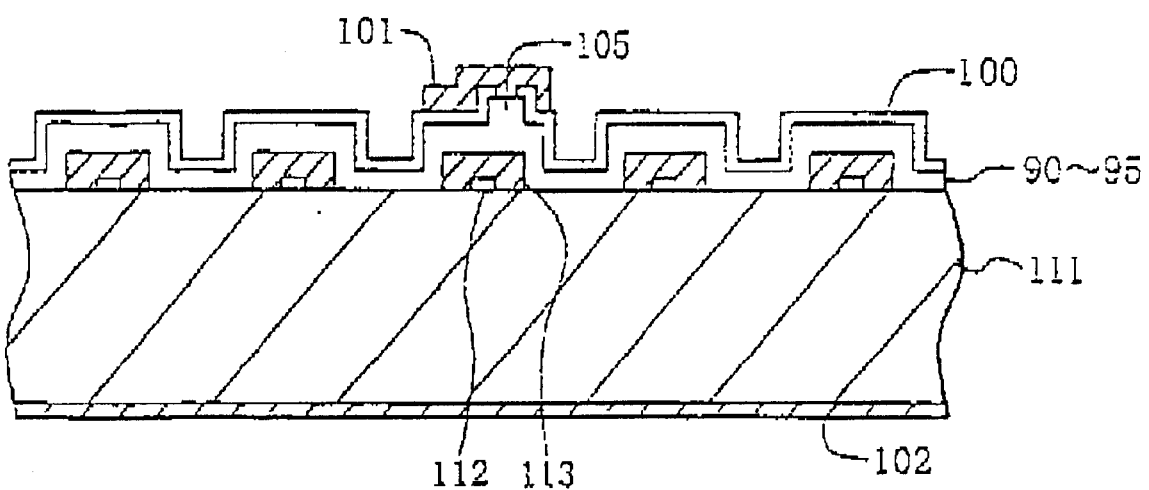

As shown in FIG. 35, a laser structure is formed on the AlGAN pattern 113, and an n-side electrode 102 is formed on the bottom surface of the SiC substrate 111. The laser structure and its manufacture method are similar to those of the sixth embodiment shown in FIGS. 30 and 31. In FIG. 35, like constituent elements to those shown in FIG. 30 are represented by using identical reference numerals.

As viewed along the substrate normal line direction, the ridge 105 is disposed so as not to be superposed upon the AlGaN pattern 112. The laser oscillation region is therefore disposed above the region in the GaN buffer layer 113 having a low dislocation density formed through the lateral growth. The threshold value of a semiconductor laser can be lowered and reliability can be improved. In the seventh embodiment, since air gap is not formed under the light radiation region, high heat dissipation characteristics can be obtained.

Figure 36:
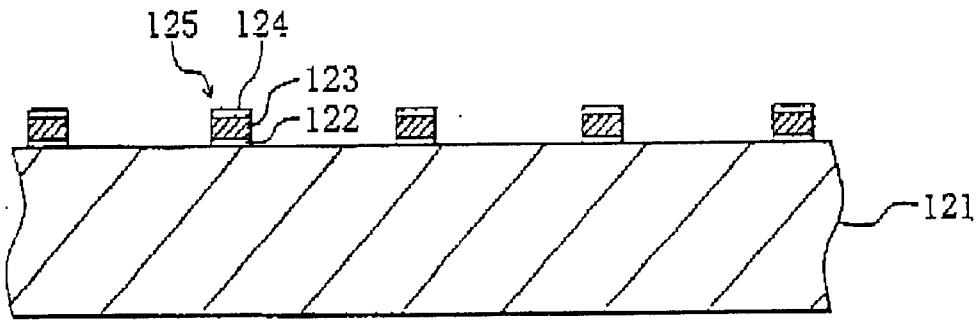

Next, with reference to FIGS. 36 to 38, the eighth embodiment will be described.

Processes of forming the structure shown in FIG. 36 will be described. On the surface of an SiC substrate 121, an n-type AlGaN layer, an n-type GaN layer and an SiO₂ layer are formed in this order. The SiC substrate 121 is similar to the SiC substrate 11 of the first embodiment shown. In FIG. 1. The n-type AlGaN layer has a thickness of 0.1 μm, an impurity concentration of 6×10¹⁸ cm⁻³ and an Al composition ratio of 9%. The n-type GaN layer has a thickness of 1.5 μm and an impurity concentration of 6×10¹⁸ cm⁻³. The SiO₂ film has a thickness of 0.1 μm.

These three layers are patterned to form a plurality of striped lamination patterns 125. The lamination pattern 125 has the three-layer structure of an n-type AlGaN pattern 122, an n-type GaN pattern 123 and an SiO₂ pattern 124 stacked one upon another in this order. Each of the lamination patterns 125 is disposed in parallel to the <1–100> direction of the SiC substrate 121, and has a width of 4 μm and a pitch of 30 μm.

Figure 37:
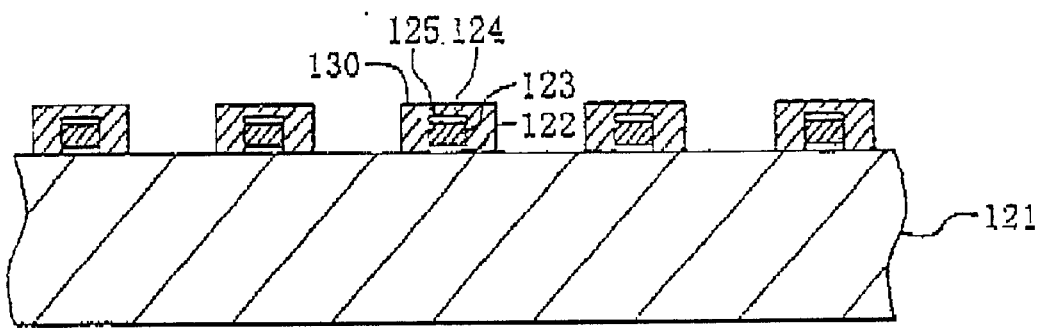
FIGS. 37 and 38 are cross sectional views of a substrate illustrating the processes of a method of manufacturing a semiconductor laser according to an eighth embodiment of the invention.

As shown in FIG. 37, by using the AlGaN patterns 122 and GaN patterns 123 as seed crystals, an n-type GaN buffer layer 130 is selectively grown by MOVPE. Similar to the selective growth shown in FIGS. 15 to 17, the lateral growth of crystal starts from the side walls of the AlGaN patterns 122 and GaN patterns 123. As the crystal growth continues further, the side walls and upper surface of the lamination pattern 125 are covered with the n-type GaN buffer layer 130.

Crystal growth is stopped before adjacent GaN buffer layers 130 grown from the lamination patterns 125 are coupled together. The n-type GaN buffer layer 130 is 4 μm thick and 18 μm wide and has an impurity concentration of $3 \times 10^{17}$ cm$^{-3}$. The thickness of the n-type GaN buffer layer 130 is a thickness as measured from the surface of the SiC substrate 121. As seen from FIG. 32, at this film thickness and width, cracks are not generated in the GaN buffer layer 130.

Figure 38:
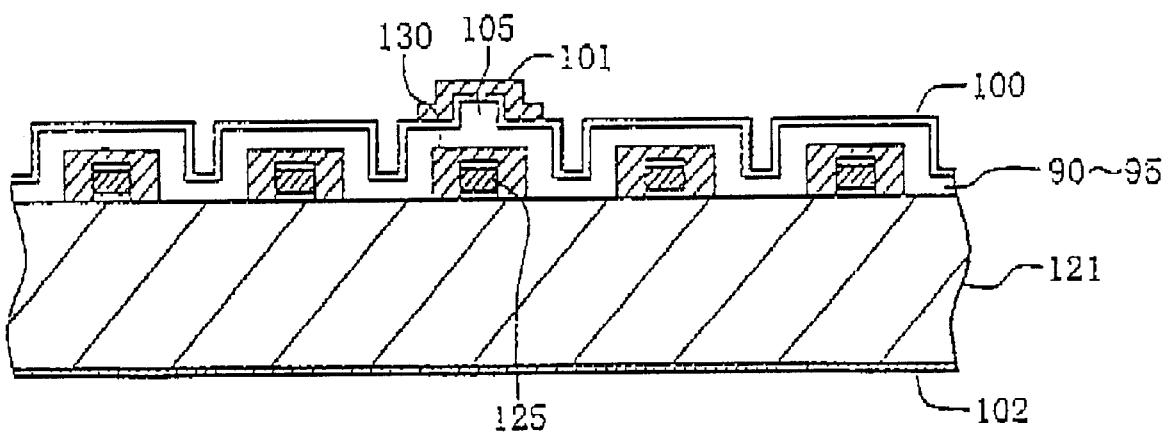
Figure 39:
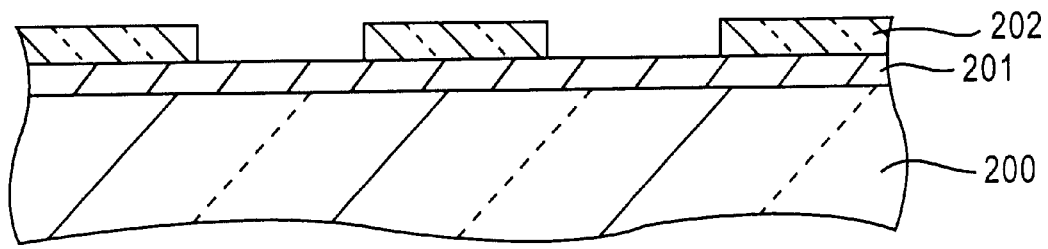
FIGS. 39 to 42 are cross sectional views of a substrate illustrating a method of forming a GaN buffer layer on a sapphire substrate according to conventional techniques.
Figure 40:
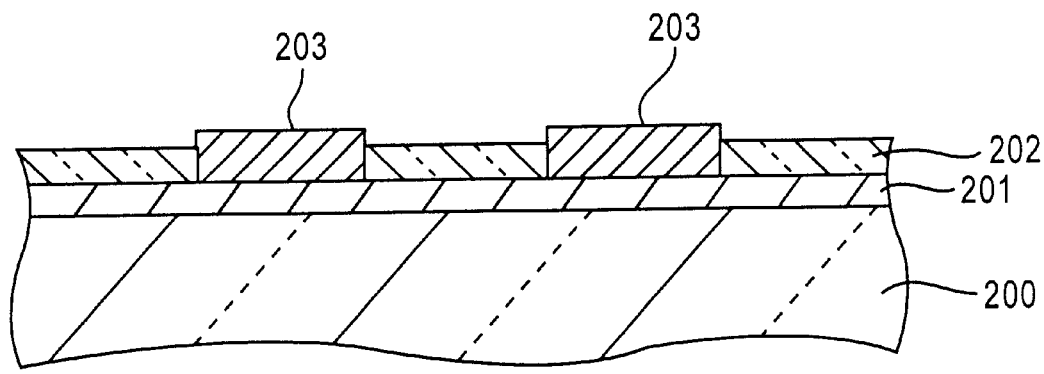
Figure 41:
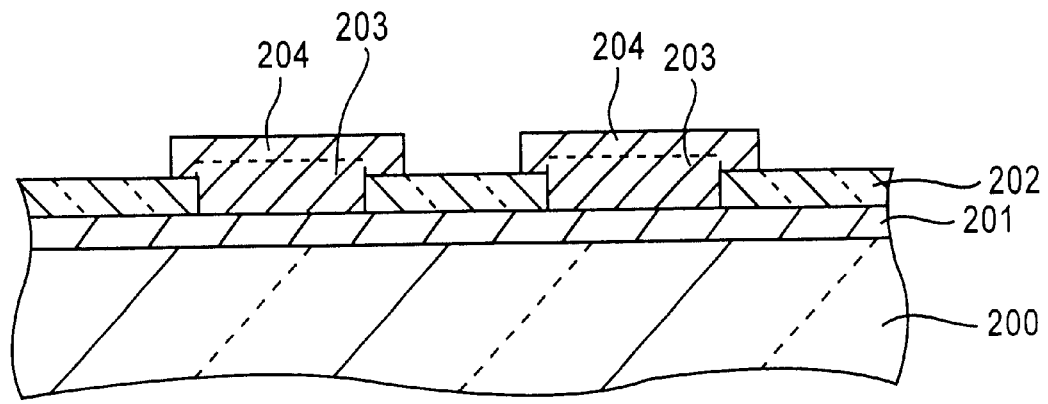
Figure 42:
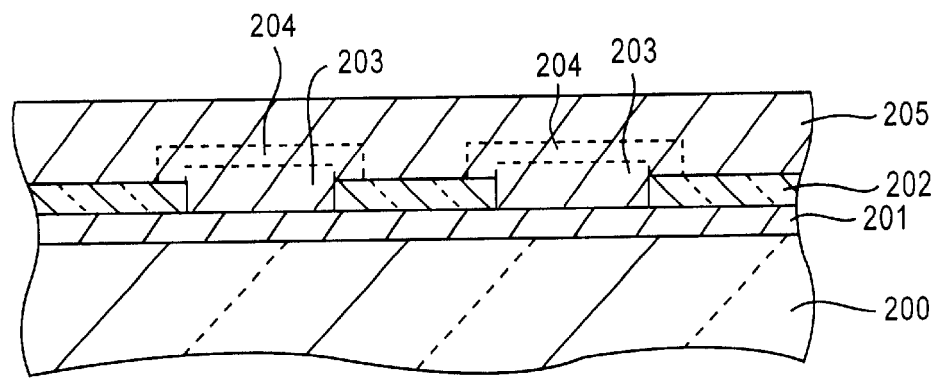
Figure 43:
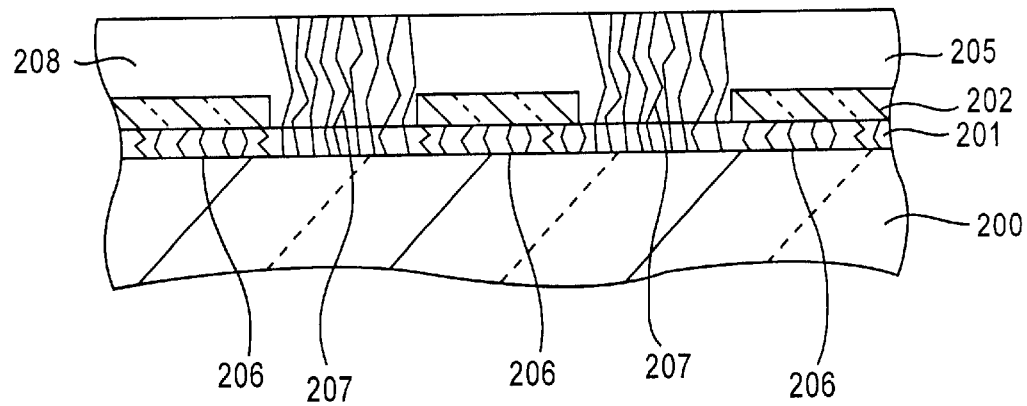
FIGS. 43 and 44 are schematic cross sectional views illustrating dislocations in a GaN buffer layer when the GaN buffer layer is formed on a sapphire substrate by using a conventional method.
Figure 44:
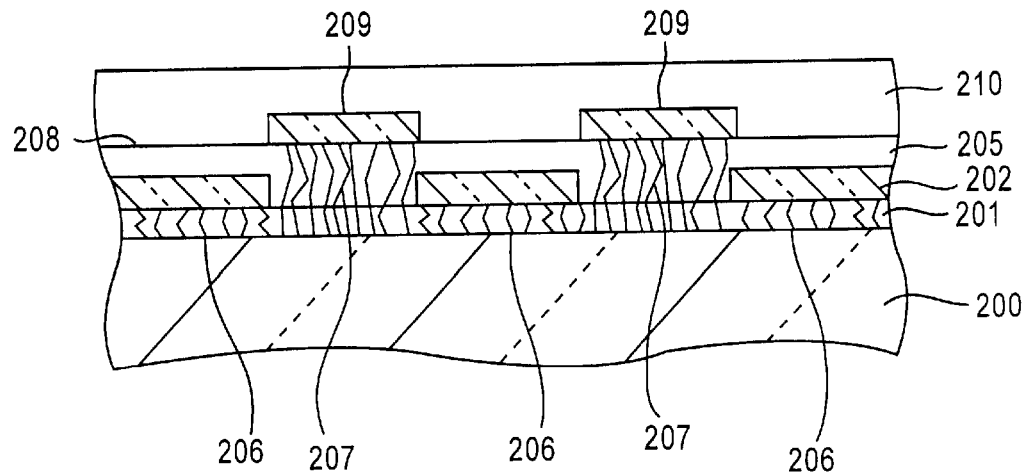
Figure 45:
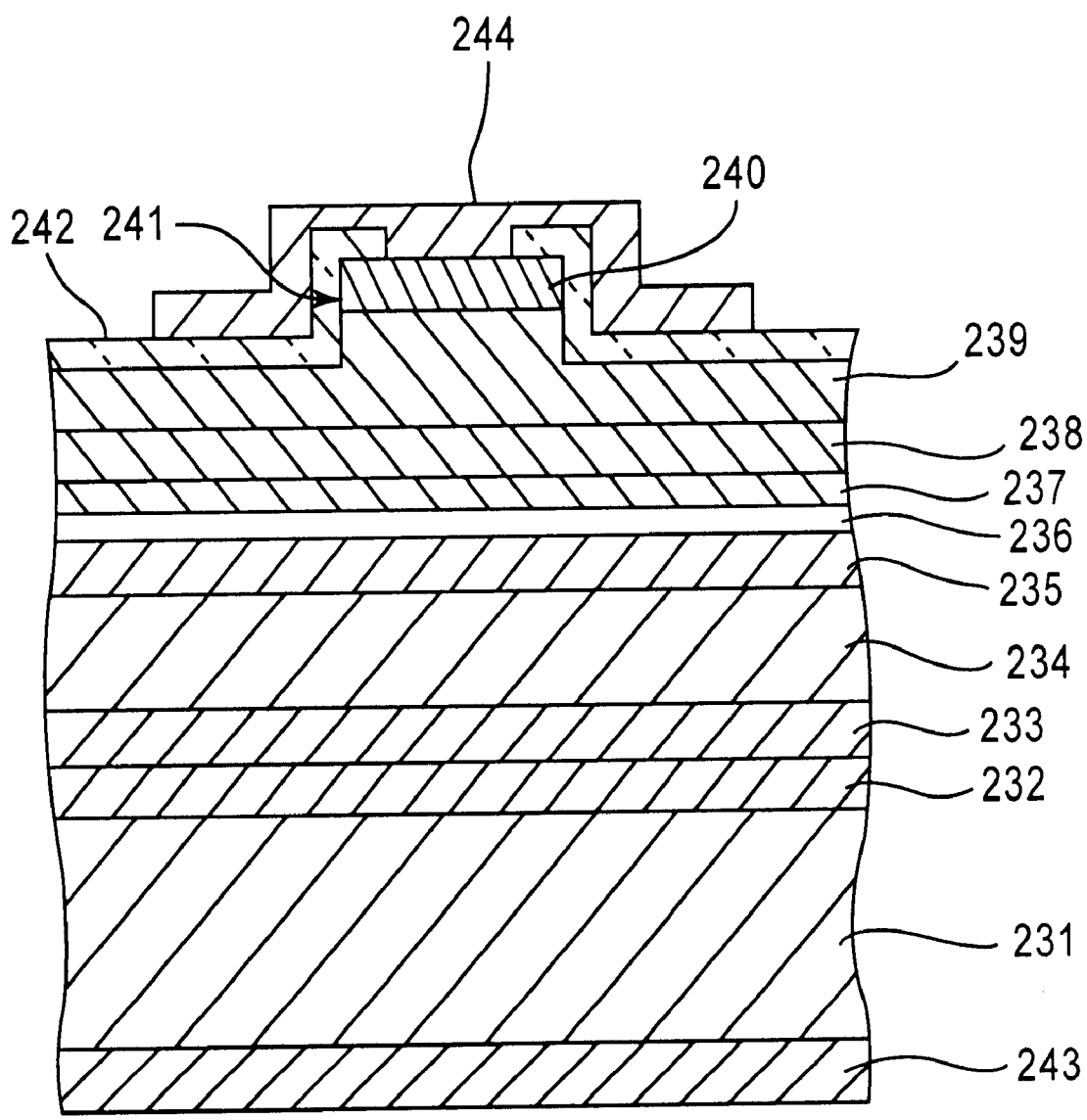
FIG. 45 is a cross sectional view of a GaN based semiconductor laser formed on a SiC substrate according to conventional techniques.

As shown in FIG. 38, a laser structure is formed on the GaN buffer layer 130, and an n-side electrode 102 is formed on the bottom surface of the SiC substrate 121. The laser structure and its manufacture method are similar to those of the sixth embodiment shown in FIGS. 30 and 31. In FIG. 38, like constituent elements to those shown in FIG. 30 are represented by using identical reference numerals.

The n-type GaN buffer layer 130 has a low dislocation density in the whole region thereof. The ridge 105 can therefore be disposed in any region above the n-type GaN buffer layer 130. Similar to the seventh embodiment, also in the eighth embodiment, the threshold value of a semiconductor laser can be lowered and reliability can be improved.

In the sixth to eighth embodiments, the GaN layer is used as the lower-level buffer layer on which the laser structure is formed. This buffer layer may be generally an $Al_yGa_{1-y}N$ layer. GaN or AlGaN is used as seed crystals for the selective growth of the buffer layer. Seed crystals may be generally $Al_xGa_{1-x}N$. If the Al composition ratio x of seed crystals and the Al composition ratio y of the buffer layer are selected to satisfy the relation of y<x, then the selective growth becomes easy. It is preferable therefore that the relation between x and y is set to y<x. If the Al composition ratio x of $Al_xGa_{1-x}N$ as seed crystals is 0, i.e., if seed crystals are GaN, the Al composition ratio y of the buffer layer is also set to 0, i.e., the buffer layer is also made of GaN.

The present invention has been described in connection with the preferred embodiments. The invention is not limited only to the above embodiments. It is apparent that various modifications, improvements, combinations, and the like can be made by those skilled in the art.

What we claim are:

1. A semiconductor laser comprising:
   a substrate made of SiC;
   a plurality of $Al_xGa_{1-x}N$ striped patterns ($0 \leq x \leq 1$) formed on a surface of said substrate and dispersively distributed in an in-plane of said substrate;
   an $Al_yGa_{1-y}N$ buffer layer ($0 \leq y \leq 1$) covering the surface of said substrate and said $Al_xGa_{1-x}N$ patterns; and
   a laser structure formed on said $Al_yGa_{1-y}N$ buffer layer.

2. A semiconductor laser comprising:
   a substrate made of SiC;
   a plurality of $Al_xGa_{1-x}N$ patterns ($0 \leq x \leq 1$) formed on a surface of said substrate and dispersively distributed in an in-plane of said substrate;
   an $Al_yGa_{1-y}N$ buffer layer ($0 \leq y \leq 1$) covering the surface of said substrate and said $Al_xGa_{1-x}N$ patterns; and
   a laser structure formed on said $Al_yGa_{1-y}N$ buffer layer, wherein x of said $Al_xGa_{1-x}N$ pattern and y of said $Al_yGa_{1-y}N$ buffer layer satisfy a relation of y<x.

3. A semiconductor laser comprising:
   a substrate made of SiC;
   a plurality of $Al_xGa_{1-x}N$ patterns ($0 \leq x \leq 1$) formed on a surface of said substrate and dispersively distributed in an in-plane of said substrate;
   an $Al_yGa_{1-y}N$ buffer layer ($0 \leq y \leq 1$) covering the surface of said substrate and said $Al_xGa_{1-x}N$ patterns; and
   a laser structure formed on said $Al_yGa_{1-y}N$ buffer layer, wherein x of said $Al_xGa_{1-x}N$ pattern satisfies an inequality $0.09 \leq x \leq 0.40$.

4. A semiconductor laser comprising:
   a substrate made of SiC;
   a plurality of $Al_xGa_{1-x}N$ patterns ($0 \leq x \leq 1$) formed on a surface of said substrate and dispersively distributed in an in-plane of said substrate;
   an $Al_yGa_{1-y}N$ buffer layer ($0 \leq y \leq 1$) covering the surface of said substrate and said $Al_xGa_{1-x}N$ patterns; and
   a laser structure formed on said $Al_yGa_{1-y}N$ buffer layer, wherein as viewed along a direction normal to the surface of said substrate, an oscillation region of said laser structure is disposed so as not to be superposed upon said $Al_xGa_{1-x}N$ pattern.

5. A semiconductor laser comprising:
   a substrate made of SiC;
   a plurality of $Al_xGa_{1-x}N$ patterns ($0 \leq x \leq 1$) formed on a surface of said substrate and dispersively distributed in an in-plane of said substrate;
   an $Al_yGa_{1-y}N$ buffer layer ($0 \leq y \leq 1$) covering the surface of said substrate and said $Al_xGa_{1-x}N$ patterns; and
   a laser structure formed on said $Al_yGa_{1-y}N$ buffer layer, wherein as viewed along a direction normal to the surface of said substrate, an oscillation region of said laser structure is completely included in said $Al_xGa_{1-x}N$ pattern.

6. A nitride based group III-V compound semiconductor device, comprising:
   a semiconductor substrate;
   a lamination pattern formed on a partial surface of said semiconductor substrate, said lamination pattern including a lower-level layer made of nitride based group III-V compound semiconductor and a higher-level layer made of different material from the nitride based group III-V compound semiconductor; and
   a grown layer covering said lamination pattern, said grown layer being made of nitride based compound semiconductor easier to be grown on side walls of the lower-level layer than on a surface of the higher-level layer.

7. A nitride based group III-V compound semiconductor device according to claim 6, further comprising a laser structure including a double hetero structure and formed on said grown layer.

8. A semiconductor laser comprising:
   a semiconductor substrate;
   a buffer layer disposed on a partial surface of said semiconductor substrate, said buffer layer being made of group III-V compound semiconductor and including an eaves portion; and
   a laser structure formed on said buffer layer, an oscillation region of said laser structure being disposed so as to be superposed upon the eaves portion, as viewed along a direction normal to a surface of said semiconductor substrate.

9. A semiconductor laser according to claim 8, wherein at least some semiconductor layers constituting said laser structure covers side walls of the eaves portion of said buffer region and reaches the surface of said semiconductor substrate to define air gaps between the eaves portion and the surface of said semiconductor substrate.

10. A semiconductor laser comprising:
    a semiconductor substrate;
    an AlGaN pattern formed on a partial surface of said semiconductor substrate, said AlGaN pattern being made of $Al_xGa_{1-x}N$ ($0 \leq x \leq 1$);

a buffer layer made of $Al_yGa_{1-y}N$ ($0 \leq y \leq 1$) and covering a surface of said AlGaN pattern and surfaces of said semiconductor substrate on both sides of said AlGaN pattern;

a semiconductor layer covering a surface of said buffer layer and surfaces of said semiconductor substrate on both sides of said buffer layer; and a laser structure formed on said buffer layer, an oscillation region of said laser structure being disposed so as not to be superposed upon said AlGaN pattern as viewed along a direction normal to the surface of said semiconductor substrate.

11. A semiconductor laser according to claim 10, wherein x of said $Al_xGa_{1-x}N$ pattern and y of said $Al_yGa_{1-y}N$ buffer layer satisfy a relation of $y<x$.

12. A nitride based group III-V compound semiconductor device, comprising:

a semiconductor substrate;

a lamination pattern formed on a partial surface of said semiconductor substrate, said lamination pattern including a lower-level layer made of nitride based group III-V compound semiconductor and a higher-level layer made of different material from the nitride based group III-V compound semiconductor; and a buffer region made of nitride based compound semiconductor and covering a surface of said lamination pattern and surfaces of said semiconductor substrate on both sides of said lamination pattern, the nitride based compound semiconductor being easier to grow on side walls of the lower-level layer than on a surface of the higher-level layer.

13. A nitride based group III-V compound semiconductor device according to claim 12, further comprising a laser structure formed above said buffer region and including a double hetero structure.

14. A nitride based group III-V compound semiconductor device according to claim 13, wherein at least some semiconductor layers constituting said laser structure cover side walls of said buffer region and reach the surface of said semiconductor substrate.

* * * * *